(12) United States Patent
De Luca et al.

(10) Patent No.: US 11,035,709 B2
(45) Date of Patent: Jun. 15, 2021

(54) CMOS THERMAL FLUID FLOW SENSING DEVICE EMPLOYING A FLOW SENSOR AND A PRESSURE SENSOR ON A SINGLE MEMBRANE

(71) Applicant: Cambridge Enterprise Limited, Cambridge (GB)

(72) Inventors: Andrea De Luca, Cambridge (GB); Florin Udrea, Cambridge (GB)

(73) Assignee: CAMBRIDGE ENTERPRISE LIMITED, Cambridge (GB)

(*) Notice: Subject to any disclaimer, the term of this patent is extended or adjusted under 35 U.S.C. 154(b) by 0 days.

(21) Appl. No.: 16/478,559

(22) PCT Filed: Dec. 19, 2017

(86) PCT No.: PCT/GB2017/053796
§ 371 (c)(1),
(2) Date: Jul. 17, 2019

(87) PCT Pub. No.: WO2018/134552
PCT Pub. Date: Jul. 26, 2018

(65) Prior Publication Data
US 2020/0049539 A1 Feb. 13, 2020

(30) Foreign Application Priority Data
Jan. 17, 2017 (GB) .................... 1700798

(51) Int. Cl.
*G01F 1/68* (2006.01)
*G01F 1/688* (2006.01)
(Continued)

(52) U.S. Cl.
CPC .......... *G01F 1/6888* (2013.01); *B81B 7/0087* (2013.01); *B81C 1/00246* (2013.01);
(Continued)

(58) Field of Classification Search
None
See application file for complete search history.

(56) References Cited

U.S. PATENT DOCUMENTS 3,992,940 A    11/1976  Platzer, Jr.
4,608,865 A     9/1986  Muller et al.
(Continued)

FOREIGN PATENT DOCUMENTS

CN   1058647 A   2/1992
CN   1174984 A   3/1998
(Continued)

OTHER PUBLICATIONS

International Search Report and Written Opinion from International Application No. PCT/GB2017/053796, dated Mar. 8, 2018, 14 pages.
(Continued)

*Primary Examiner* — Harshad R Patel
(74) *Attorney, Agent, or Firm* — Tucker Ellis LLP

(57) ABSTRACT

A CMOS-based sensing device includes a substrate including an etched portion and a first region located on the substrate. The first region includes a membrane region formed over an area of the etched portion of the substrate, a flow sensor formed within the membrane region and a pressure sensor formed within the membrane region.

19 Claims, 14 Drawing Sheets

(51) Int. Cl.

| | |
|---|---|
| B81B 7/00 | (2006.01) |
| B81C 1/00 | (2006.01) |
| G01F 1/684 | (2006.01) |
| G01F 1/69 | (2006.01) |
| G01F 1/698 | (2006.01) |
| G01K 7/02 | (2021.01) |
| G01L 9/06 | (2006.01) |
| H01L 21/306 | (2006.01) |
| H01L 21/3065 | (2006.01) |
| H01L 23/34 | (2006.01) |
| H01L 23/48 | (2006.01) |
| H01L 27/06 | (2006.01) |
| H01L 27/16 | (2006.01) |
| H01L 29/66 | (2006.01) |
| H01L 29/84 | (2006.01) |
| H01L 35/20 | (2006.01) |
| H01L 35/32 | (2006.01) |
| H01L 35/34 | (2006.01) |

(52) U.S. Cl.
CPC ............ *G01F 1/6845* (2013.01); *G01F 1/69* (2013.01); *G01F 1/6986* (2013.01); *G01K 7/02* (2013.01); *G01L 9/065* (2013.01); *H01L 21/3065* (2013.01); *H01L 21/30604* (2013.01); *H01L 23/345* (2013.01); *H01L 23/481* (2013.01); *H01L 27/0617* (2013.01); *H01L 27/16* (2013.01); *H01L 29/66075* (2013.01); *H01L 29/66992* (2013.01); *H01L 29/84* (2013.01); *H01L 35/20* (2013.01); *H01L 35/32* (2013.01); *H01L 35/34* (2013.01); *B81B 2201/0271* (2013.01); *B81B 2203/0127* (2013.01); *B81B 2207/096* (2013.01); *B81C 2201/0132* (2013.01); *B81C 2201/0133* (2013.01); *B81C 2203/0742* (2013.01)

(56) References Cited

U.S. PATENT DOCUMENTS

| | | | | |
|---|---|---|---|---|
| 4,744,246 | A | 5/1988 | Busta | |
| 5,830,372 | A | 11/1998 | Hierold | |
| 6,460,411 | B1* | 10/2002 | Kersjes | G01F 1/6845 73/204.26 |
| 7,360,415 | B2* | 4/2008 | Nakano | G01F 1/6845 73/204.26 |
| 7,367,232 | B2* | 5/2008 | Vaganov | G01P 15/123 73/514.33 |
| 7,399,118 | B2 | 7/2008 | Matter et al. | |
| 7,765,679 | B2* | 8/2010 | Yao | G01F 1/6845 216/16 |
| 2004/0159161 | A1* | 8/2004 | Barnett | G01L 9/0055 73/766 |
| 2005/0000283 | A1* | 1/2005 | Kawai | G01F 1/698 73/204.26 |
| 2007/0113665 | A1 | 5/2007 | Johnson | |
| 2009/0129440 | A1 | 5/2009 | Opitz et al. | |
| 2010/0078753 | A1* | 4/2010 | Mehregany | G01F 1/6888 257/467 |
| 2010/0242592 | A1 | 9/2010 | Haneef et al. | |
| 2011/0107832 | A1* | 5/2011 | Sakuma | G01F 1/6842 73/204.26 |
| 2011/0146398 | A1* | 6/2011 | Beck | G01F 1/6845 73/204.27 |
| 2012/0267532 | A1 | 10/2012 | Udrea et al. | |
| 2012/0318058 | A1* | 12/2012 | Kimura | G01F 1/6845 73/204.23 |
| 2016/0216144 | A1 | 7/2016 | Figi et al. | |
| 2018/0086629 | A1* | 3/2018 | Manos | G01K 7/01 |
| 2019/0226921 | A1* | 7/2019 | Zivkovic | G01K 11/24 |

FOREIGN PATENT DOCUMENTS

| | | |
|---|---|---|
| CN | 101086456 A | 12/2007 |
| CN | 103969296 A | 8/2014 |
| CN | 104285500 A | 1/2015 |
| CN | 104412082 A | 3/2015 |
| CN | 104730283 A | 6/2015 |
| CN | 106017587 A | 10/2016 |
| DE | 3327653 A1 | 2/1984 |
| EP | 0076935 A2 | 4/1983 |
| EP | 1995571 A1 | 11/2008 |
| JP | H0599942 A | 4/1993 |
| WO | 2005001422 A2 | 1/2005 |

OTHER PUBLICATIONS

Combined Search and Examination Report from corresponding United Kingdom Application No. GB 1700798.0, dated Jun. 23, 2017, 9 pages.

E. Yoon and K. D. Wise, "An integrated mass flow sensor with on-chip CMOS interface circuitry," Electron Devices, IEEE Transactions on, vol. 39, pp. 1376-1386, 1992.

Anonymous "Silicon bandgap temperature sensor—Wikipedia", Nov. 18, 2016; retrieved from Internet URL: https://web.archive.org/web/20161118133754/https://en.wikipedia.org/wiki/Siliconbandgap temperature sensor.

International Preliminary Report on Patentability from corresponding International Application No. PCT/GB2017/053796, dated Aug. 1, 2019, 22 pages.

J. T. Kuo et al., "Micromachined Thermal Flow Sensors—A Review," Micromachines, vol. 3, pp. 550-573, 2012.

B. Van Oudheusden, "Silicon flow sensors," in Control Theory and Applications, IEE Proceedings D, 1988, pp. 373-380.

B. Van Oudheusden, "Silicon thermal flow sensors," Sensors and Actuators A: Physical, vol. 30, pp. 5-26, 1992.

N. Nguyen, "Micromachined flow sensors—A review," Flow measurement and Instrumentation, vol. 8, pp. 7-16, 1997.

Y.-H. Wang et al., "MEMS-based gas flow sensors," Microfluidics and nanofluidics, vol. 6, pp. 333-346, 2009.

International Search Report and Written Opinion for corresponding PCT/GB2017/053800, dated Mar. 6, 2018, 13 pages.

Combined Search and Examination Report from corresponding United Kingdom Application No. GB 1700796.4, dated Jun. 26, 2017, 9 pages.

A. Van Putten, "An integrated silicon double bridge anemometer," Sensors and Actuators, vol. 4, pp. 387-396, 1983.

A. Van Putten and S. Middelhoek, "Integrated silicon anemometer," Electronics Letters, vol. 10, pp. 425-426, 1974.

B. Van Oudheusden and J. Huijsing, "Integrated flow friction sensor," Sensors and Actuators, vol. 15, pp. 135-144, 1988.

A. Van der Wiel et al.,"A liquid velocity sensor based on the hot-wire principle," Sensors and Actuators A: Physical, vol. 37, pp. 693-697, 1993.

J. H. Huijsing et al., "Monolithic integrated direction-sensitive flow sensor," Electron Devices, IEEE Transactions on, vol. 29, pp. 133-136, 1982.

R. Kersjes et al., "An integrated sensor for invasive blood-velocity measurement," Sensors and Actuators A: Physical, vol. 37, pp. 674-678, 1993.

W. S. Kuklinski et al., "Integrated-circuit bipolar transistor array for fluid-velocity measurements," Medical and Biological Engineering and Computing, vol. 19, pp. 662-664, 1981.

L. Lofdahl et al., "A sensor based on silicon technology for turbulence measurements," Journal of Physics E: Scientific Instruments, vol. 22, p. 391, 1989.

D. Moser et al., "Silicon gas flow sensors using industrial CMOS and bipolar IC technology," Sensors and Actuators A: Physical, vol. 27, pp. 577-581, 1991.

N. Sabaté et al., "Multi-range silicon micromachined flow sensor," Sensors and Actuators A: Physical, vol. 110, pp. 282-288, 2004.

T. Qin-Yi and H. Jin-Biao, "A novel CMOS flow sensor with constant chip temperature (CCT) operation," Sensors and actuators, vol. 12, pp. 9-21, 1987.

(56) References Cited

OTHER PUBLICATIONS

Dan Li, et al. "A monolithic piezoresistive pressure flow sensor with integrated signal conditioning circuit", IEEE Sensors Journal vol. 11, No. 9, Sep. 2011, pp. 2122-2128.

Mansoor et al., "An SOI CMOS-based multi-sensor MEMS Chip for fluidic applications", Sensors, Nov. 4, 2016, pp. 1-16.

Kaelvesten E. et al, "An integrated pressure-flow sensor for correlation measurements in turbulent gas flows", Sensors and Actuators A: Physical, Elsevier, vol. A52, No. 1/03, Mar. 1, 1996, pp. 51-58.

W. P. Eaton and J. H. Smith, "Micromachined pressure sensors: review and recent developments," Smart Materials and Structures, vol. 6, p. 530, 1997.

K. Bhat, "Silicon micromachined pressure sensors," Journal of the Indian Institute of Science, vol. 87, p. 115, 2012.

S. S. Kumar and B. Pant, "Design principles and considerations for the 'ideal' silicon piezoresistive pressure sensor: a focused review," Microsystem technologies, vol. 20, pp. 1213-1247, 2014.

O. Tabata et al., "Monolithic pressure-flow sensor," Electron Devices, IEEE Transactions on, vol. 34, pp. 2456-2462, 1987.

Y. Xu et al., "Mass flowmeter using a multi-sensor chip," in Micro Electro Mechanical Systems, 2000. The Thirteenth Annual International Conference on, 2000, pp. 541-546.

Y. Xu et al., "A MEMS multi-sensor chip for gas flow sensing," Sensors and Actuators A: Physical, vol. 121, pp. 253-261, 2005.

C. L. Roozeboom et al., "Integrated multifunctional environmental sensors," Microelectromechanical Systems, Journal of, vol. 22, pp. 779-793, 2013.

\* cited by examiner

CMOS THERMAL FLUID FLOW SENSING DEVICE EMPLOYING A FLOW SENSOR AND A PRESSURE SENSOR ON A SINGLE MEMBRANE

FIELD OF THE INVENTION

The present invention relates to a single membrane flow-pressure sensor in which piezo-elements, heating elements and temperature sensing elements are embedded within the same membrane.

BACKGROUND OF THE INVENTION

Thermal fluid flow sensors rely on the thermal interaction between the sensor itself and the fluid. Depending upon the physical phenomena governing the interaction, flow sensors can be can be classified into the following three categories: (i) anemometric sensors measure the convective heat transfer induced by fluid flow passing over a heated element; (ii) calorimetric sensors detect the asymmetry of the temperature profile generated by a heated element and caused by the forced convection of the fluid flow; (iii) time of flight (ToF) sensors measure the time elapsed between the application and the sensing of a heat pulse. Detailed reviews of thermal fluid flow sensor have been published (B. Van Oudheusden, "Silicon flow sensors," in Control Theory and Applications, IEE Proceedings D, 1988, pp. 373-380; B. Van Oudheusden, "Silicon thermal flow sensors," Sensors and Actuators A: Physical, vol. 30, pp. 5-26, 1992; N. Nguyen, "Micromachined flow sensors-A review," Flow measurement and Instrumentation, vol. 8, pp. 7-16, 1997; Y.-H. Wang et al., "MEMS-based gas flow sensors," Microfluidics and nanofluidics, vol. 6, pp. 333-346, 2009; J. T. Kuo et al., "Micromachined Thermal Flow Sensors-A Review," Micromachines, vol. 3, pp. 550-573, 2012). Further background can also be found in U.S. Pat. No. 6,460,411 by Kersjes et al. A typical thermal flow sensor comprises a heating element and a temperature sensing element thermally isolated from the substrate (e.g. embedded within a membrane, a bridge, a cantilever, etc.). Both heating and temperature sensing elements are typically positioned in the most thermally isolated area (e.g. in the centre of a membrane, in the centre of a bridge, and the end of a cantilever, etc.).

Micromachined pressure sensors are based on measuring the mechanical deformation caused in a membrane (or a cantilever) when it experiences stress due to the pressure being sensed. Depending upon the physical phenomena governing the mechano-electrical transduction, pressure sensors can be classified into four categories: (i) piezoelectric, based on changes of electrical resistance due to geometric changes or piezoresistivity; (ii) capacitive, based on changes in capacitance; (iii) resonance, based on changes in resonant frequency of vibrating elements in the structure; or (vi) optical, based on changes of optical resonance. Detailed reviews on the topic can be found in W. P. Eaton and J. H. Smith, "Micromachined pressure sensors: review and recent developments," Smart Materials and Structures, vol. 6, p. 530, 1997, in K. Bhat, "Silicon micromachined pressure sensors," Journal of the Indian Institute of Science, vol. 87, p. 115, 2012 and in S. S. Kumar and B. Pant, "Design principles and considerations for the 'ideal' silicon piezoresistive pressure sensor: a focused review," Microsystem technologies, vol. 20, pp. 1213-1247, 2014. In relation to this invention the piezoelectric category is of particular interest. A piezoelectric pressure sensor typically comprises a deformable structure (e.g. a membrane, a beam, a cantilever, etc.) anchored to a substrate. Typically at least one piezo-element (e.g. a piezoresistors, a piezodiode, a piezoFET, etc.) is placed in the area susceptible to maximum mechanical stress, typically in proximity of the edge between the deformable structure and the substrate.

In O. Tabata et al., "Monolithic pressure-flow sensor," Electron Devices, IEEE Transactions on, vol. 34, pp. 2456-2462, 1987 a silicon-based monolithic pressure-flow sensor is reported. Its operation is based on the piezoresistive effect for pressure sensing and heat transfer for flow sensing. The sensor chip has a first thermal isolation structure that is made of an oxidized porous silicon membrane. This structure thermally isolates the heating element located on the membrane from the rest of the chip. A second membrane allocates the pressure sensing elements.

E. Yoon and K. D. Wise, "An integrated mass flow sensor with on-chip CMOS interface circuitry," Electron Devices, IEEE Transactions on, vol. 39, pp. 1376-1386, 1992 report on a monolithic mass flow sensor capable of measuring gas flow velocity, direction, type, temperature, and pressure. Thermal transducers (the ones measuring gas flow velocity, direction and type) are supported on a micromachined dielectric window. The pressure transducer is supported on a second micromachined dielectric window.

Y. Xu et al., "Mass flowmeter using a multi-sensor chip," in Micro Electro Mechanical Systems, 2000. The Thirteenth Annual International Conference on, 2000, pp. 541-546 report on a mass flowmeter using a multisensory chip that includes a 1-D array of pressure, temperature and shear stress sensors. The pressure and the shear stress sensor are placed on two different membranes.

Similar chips having the pressure sensing elements and the flow sensing elements on different membranes are also reported in Y. Xu et al., "A MEMS multi-sensor chip for gas flow sensing," Sensors and Actuators A: Physical, vol. 121, pp. 253-261, 2005, in D. Li et al., "A monolithic piezoresistive pressure-flow sensor with integrated signal-conditioning circuit," Sensors Journal, IEEE, vol. 11, pp. 2122-2128, 2011, and in C. L. Roozeboom et al., "Integrated multifunctional environmental sensors," Microelectromechanical Systems, Journal of, vol. 22, pp. 779-793, 2013.

In E. Kälvesten et al., "An integrated pressure-flow sensor for correlation measurements in turbulent gas flows," Sensors and Actuators A: Physical, vol. 52, pp. 51-58, 1996 pressure and flow sensing elements are placed on the same membrane. However, in order to thermally isolate the two sensing elements polyamide is used, which is not suitable for high temperature operations. Furthermore, bulk etching is combined with front etching complicating the fabrication process of the device.

SUMMARY

It is an object of this invention to provide a micromachined CMOS single membrane flow-pressure sensor, wherein piezo-elements, heating elements and temperature sensing elements are embedded within the same membrane.

Flow and pressure are inter-related quantities. Interestingly, in any fluidic applications pressure sensors can be designed in such a way to provide information complementary to those provided by thermal flow sensors, because the pressure and the flow sensing mechanisms are based on different principles: pressure is sensed by transducing mechanical displacement into an electric signal, while flow is sensed by measuring the variations of heat exchange between the device itself and the environment. It is generally desirable to have on the same chip capabilities of measuring pressure and flow for different reasons, for instance: one sensor can be used to compensate for the other one; the two sensors can be used in different measured ranges; sensing principles redundancy can provide improved device lifetime; and one sensor can be used to periodically re-calibrate the other one. This is usually achieved by integrating on the same chip two membranes, a first membrane allocating the pressure sensing elements, and a second membrane allocating the flow sensing elements. In this invention the flow and pressure sensing elements are positioned within the same membrane, resulting in a significant reduction of chip size and thus costs. It will be appreciated that the term "membrane" or "membrane region" refer to an area within a region directly above the substrate in which the area corresponds to an etched portion of the substrate.

Aspects and preferred features are set out in the accompanying claims.

We disclose herein a CMOS-based sensor comprising: a substrate comprising an etched portion; a first region located on the substrate, wherein the first region comprises a membrane region formed over an area of the etched portion of the substrate; a flow sensor formed within the membrane region; and a pressure sensor formed within the membrane region.

The starting substrate may be silicon, or silicon on insulator (SOI). However, any other substrate combining silicon with another semiconducting material compatible with state-of-the-art CMOS fabrication processes may be used. Employment of CMOS fabrication processes ensures sensor manufacturability in high volume, low cost, high reproducibility and wide availability of foundries supporting the process. CMOS processes also enable on-chip circuitry for sensor performance enhancement and system integration facilitation.

The membrane region may be formed by back-etching using Deep Reactive Ion Etching (DRIE) of the substrate, which results in vertical sidewalls and thus enabling a reduction in sensor size and costs. However, the back-etching can also be done by using anisotropic etching such as KOH (Potassium Hydroxide) or TMAH (TetraMethyl Ammonium Hydroxide) which results in slopping sidewalls. The membrane region can also be formed by a front-side etch or a combination of a front-side and back-side etch to result in a suspended membrane structure, supported only by 2 or more beams. The membrane region may be circular, rectangular, or rectangular shaped with rounded corners, but other shapes are possible as well.

The (dielectric) membrane region may comprise silicon dioxide and/or silicon nitride. The membrane may also comprise one or more layers of spin on glass, and a passivation layer over the one or more dielectric layers. The employment of materials with low thermal conductivity (e.g. dielectrics) enables a significant reduction in power dissipation as well as an increase in the temperature gradients within the membrane with direct benefits in terms of sensor performance (e.g. sensitivity, frequency response, range, etc.).

The membrane may also have other structures made of polysilicon, single crystal silicon or metal. These structures can be embedded within the membrane, or may be above or below the membrane, to engineer the thermo-mechanical properties (e.g. stiffness, temperature profile distribution, etc.) of the membrane and/or the fluid dynamic interaction between the fluid and the membrane. More generally these structures can be also outside the membrane and/or bridging between inside and outside the membrane. For example, metal tracks may be used to thermally isolate the flow sensor elements from the pressure sensor elements.

The flow sensor formed within the membrane region may be a thermal flow sensor. The thermal flow sensor may comprise a p-n junction type device formed within the dielectric membrane, wherein the p-n junction type device is configured to operate as a temperature sensing device. Aspects and preferred features of the thermal flow sensor follow.

The p-n junction type device, formed within the dielectric membrane, may be a diode or an array of diodes for enhanced sensitivity and located in the area of the membrane having the highest thermal isolation towards the substrate. The diode can be made of polysilicon or of single crystal silicon.

The p-n junction type device can also be a three terminal device, i.e. a transistor. The transistor may have an accessible gate or base contact or may have the gate/base shorted to one of the other two terminals. For example, an npn transistor with the base shorted to the collector can become a p-n diode. More transistors may also be put in array form. The p-n junction type device can also be any other type of device having at least one p-n junction.

The p-n junction type device may be configured to operate as a temperature sensing device. Reference p-n junction type devices that measure the substrate/case/ambient temperature can be placed outside the membrane area and used for compensation purposes. Any of the p-n junction type devices can also be part of a more complex temperature sensing circuit, such as a VPTAT (voltage proportional to absolute temperature) or IPTAT (current proportional to absolute temperature).

According to one embodiment, the flow sensor may comprise a p-n junction type device, wherein the p-n junction type device can also be used as heating element as well as a temperature sensing device at the same time. Injection of a current into the p-n junction type device formed within the dielectric membrane results in a localised increase in temperature. The heat exchange between the p-n junction type device and the fluid can then be measured through the p-n junction type device itself and correlated to the at least one property of the fluid (e.g. velocity, flow rate, exerted wall shear stress, pressure, temperature, direction, thermal conductivity, diffusion coefficient, density, specific heat, kinematic viscosity, etc.). Sensing of such fluid properties can enable fluid discrimination. For instance, the flow sensor can sense if the fluid is in gas for or liquid form, or the sensor can discriminate between different fluids (e.g. between air and $CO_2$), or if the fluid is a mixture the sensor can measure the mixture ratio. Both qualitative (e.g. liquid or gas form) and quantitative information (e.g. gas concentration) of the fluid properties can be obtained.

In one embodiment, the flow sensor may comprise a heating element, formed within the dielectric membrane, and may be made of tungsten. Tungsten is highly electromigration resistant and permits a high current density, thus reliably reaching temperature in excess of 600° C. The heating element can also be made of single crystal silicon (n-type doped, p-type doped or un-doped), polysilicon (n-type doped, p-type doped or un-doped), aluminium, titanium, silicides or any other metal available in a state-of-the-art CMOS process. The heating element can be provided with both amperometric and voltammetric connections allowing 4-wire type measurement of its resistance. Injection of a current into the resistive heating element results in a localised increase in temperature. The heat exchange between the heating element and the fluid may then be measured through the p-n junction type device and correlated to the at least one property of the fluid. Advantageously the p-n type device may be made very small and placed right underneath the resistive heating element in the area of the membrane having the highest increase in temperature, resulting in increased performance of the sensor (e.g. sensitivity, frequency response, range, etc.).

The p-n junction may be operated in the forward bias mode where the forward voltage across the diode decreases linearly with the temperature (for silicon this slope is −1 to 2 mV/° C.) when operated at a constant forward current, or can be operated in the reverse bias mode where the leakage is exponentially dependent on a temperature. The former method is the preferred method because of the linearity and the precision and reproducibility of the forward voltage mode. The latter has higher sensitivity, but the leakage current is less reproducible from one device to another or from one lot of devices to another.

The heater and the p-n junction type device may be operated in a pulse mode (e.g. driven with a square wave, sinusoidal wave, Pulse Width Modulated wave, etc.) or continuous mode. The pulse mode has, among others, the advantage of reduced power consumption, reduced electromigration for enhanced device reliability/lifetime and improved fluid properties sensing capabilities.

In one embodiment, the flow sensor may comprise one or more additional thermopiles used as temperature sensing elements. A thermopile comprises one or more thermocouples connected in series. Each thermocouple comprises two dissimilar materials which form a junction at a first region of the membrane, while the other ends of the materials form a junction at a second region of the membrane or in the heat sink region (substrate outside the membrane area), where they are connected electrically to the adjacent thermocouple or to pads for external readout.

The thermocouple materials may comprise metal such as aluminium, tungsten, titanium or combination of those or any other metal available in a state-of-the-art CMOS process, doped polysilicon (n or p type) or doped single crystal silicon (n or p type). In the case that both the materials are polysilicon and/or single crystal silicon, a metal link might be used to form the junctions between them.

The position of each junction of a thermocouple and the number and the shape of the thermocouples can be any required to adequately map the temperature profile distribution over the membrane to achieve a specific performance.

In one embodiment, the flow sensor may comprise one or more temperature sensing elements (p-n junction type device or thermocouple) and one or more heating elements are embedded within the membrane. The choice of the shape, position and number of temperature sensing elements and heating elements can be any required to adequately generate the temperature profile and/or map the temperature profile distribution over the membrane to achieve a specific performance, and can result in multi-directional, multi-range, multi-properties sensing capabilities. For example, the flow sensor may be designed to sense both flow rate and flow direction, or flow rate, flow direction and fluid thermal conductivity, or any other combination of fluid properties.

Additionally, redundancy of temperature sensing elements and/or heating elements can be used to improve the reliability/life time of the flow sensor and/or for integrity assessment. For example, in a first case where only a first temperature sensing element is used for flow sensing, a second temperature sensing element may be used to recalibrate the first temperature sensing element or used in place of the first temperature sensing element when aging of the first temperature sensing element occurs. In a second case, where only a first heating element is used for flow sensing, a second heating element may be used to recalibrate the first heating element or used in place of the first heating element when aging of the first heating element occurs.

The pressure sensor formed within the membrane region comprising the flow sensor may be a mechanical pressure sensor. The mechanical pressure sensor may comprise at least one piezo-element formed within the dielectric membrane, wherein the piezo-element is configured to operate as a pressure sensing device. Aspects and preferred features of the mechanical pressure sensor are described below.

The piezo-element formed within the dielectric membrane can be a piezo-resistor, a piezo-diode, a piezo-transistor, or any other device having an electrical output which can be correlated to the mechanical displacement of the membrane under an applied pressure. The piezo-element may be placed in the region of the membrane undergoing a maximum stress. The orientation of the piezo-element with respect to the semiconductor substrate crystal orientation may be the one ensuring the maximum sensitivity to stress. The materials of the piezo-element may be any available in a state-of-the-art CMOS process; for instance it can be a metal such as aluminium, tungsten, titanium, or it can be single crystal silicon (n-type doped, p-type doped or un-doped), polysilicon (n-type doped, p-type doped or un-doped), or any combination of those. The piezo-element may be also formed by a number of segments, or put in an array form, in order to efficiently occupy the region of the membrane undergoing maximum stress and minimising averaging effects and thus improving stress sensitivity. Generally, the type, the position, the orientation, the materials, the number, the shape, the size can be any and chosen to achieve specific performance.

According to one embodiment, the piezo-element formed within the dielectric membrane and configured to operate as pressure sensing device may be also part of a more complex pressure sensing circuit. For instance, four piezo resistors may be part of a full Wheatstone bridge sensing circuit; or a piezo-diode may be part of a stress sensitive voltage reference; or multiple piezo-transistor may be part of a differential amplifier. Many other alternatives are also possible.

In one embodiment, additional piezo-elements may be formed outside the dielectric membrane and configured to operate as temperature compensation devices. The additional piezo-elements will have an electric output which depends only on the substrate/case/ambient temperature, since not formed within the membrane region and thus not subject to mechanical stress under an applied pressure. Preferably the additional piezo-elements are identical to the piezo-elements embedded within the membrane. The additional piezo-elements may be also part of a more complex temperature compensation circuit. For example, four piezo-resistors may be part of a full Wheatstone bridge sensing circuit; or a piezo-diode may be part of a voltage reference, VPTAT or IPTAT; or multiple piezo-transistor may be part of a differential amplifier. Many other alternatives are also possible. The temperature compensation circuit may be part of a pressure sensing circuit. For example, the four piezo-resistors part of a full Wheatstone bridge temperature compensation circuit may be connected to a full Wheatstone bridge pressure sensing circuit to form a double Wheatstone bridge having a first pair of terminals giving an output proportional only to temperature and second pair of terminals giving an output proportional to both temperature and pressure. In this case the difference between the output of the first pair of terminals and the second pair of terminals would be proportional to pressure independently of substrate/case/ambient temperature.

According to one embodiment, the flow sensor and the pressure sensor may be operated in parallel (i.e. flow sensor and pressure sensor are operated/active simultaneously) or may be operated in series (i.e. when the flow sensor is operated/active the pressure sensor is not, and vice versa). In case, the flow sensor and the pressure sensor are operated in series, and in the phase wherein the flow sensor is active and the pressure sensor is not active, the piezo-elements of the pressure sensor may be used as additional temperature sensing elements for the flow sensor. Furthermore, in case there is more than one piezo-element embedded within the membrane, the piezo-elements operated as temperature sensing elements for the active flow sensor may also provide information on a flow direction.

In one embodiment, the substrate may comprise: more than one etched portion; a dielectric region located on the substrate, wherein the dielectric region comprises a dielectric membrane over each area of the etched portion of the substrate. At least one membrane contains any combination of the features described in the previous embodiments. An adequate choice of the features can result in multi-directional, multi-range, multi-properties sensing capabilities. For example, the sensor may be designed to have a first membrane region containing features to sense a flow rate and pressure, and a second membrane containing features to sense a flow direction and pressure, or a first membrane containing features to sense a flow rate, a flow direction and a pressure, and a second membrane containing features to sense a fluid thermal conductivity and pressure, or a first membrane containing features to sense a flow rate and pressure in a first range, and a second membrane containing features to sense a flow rate and a pressure in a second range. Any other combination of fluid properties is also possible.

The sensor, in addition to the at least one membrane containing any combination of the features described in the previous embodiments, may also be designed to have one or more additional membranes containing only flow sensing features or pressure sensing features. The additional membranes may be used for compensation purposes, to improve the sensor performance (e.g. sensitivity, range, dynamic response, etc.), to increase the sensor reliability/life time and/or for integrity assessment.

In one embodiment, analog/digital circuitry is integrated on-chip. Circuitry may comprise IPTAT, VPTAT, amplifiers, switches, multiplexers, demultiplexers, analog to digital converters, memories, RF communication circuits, timing blocks, filters or any other mean to drive and read out from the heating elements, temperature sensing elements and piezo-elements or electronically manipulate the sensor signals or enable/disable sensing elements. For example, it has been demonstrated that a heating element driven in a constant temperature mode results in an enhanced performance and having on-chip means to implement this driving method would result in a significant advancement of the state-of-the-art flow sensors. Also the driving method known as 3ω may be implemented via on-chip means, or any other driving method, such as a constant temperature difference and time of flight, is performed to achieve specific performance (e.g. power dissipation, sensitivity, dynamic response, range, fluid property detection, etc.). In absence of on-chip circuitry, this invention may also cover the off-chip implementation of such circuital blocks when applied to a sensor having one or more features described in any of the previous embodiments. Such off-chip implementation may be done in an ASIC or by discrete components, or a mix of the two.

The sensor may be packaged in a metal TO type package, in a ceramic, metal or a plastic SMD (surface mount device) package. The sensor can also be packaged directly on a PCB, or be packaged in a flip-chip method. The sensor may also be embedded in a substrate, such as a customised version of one of the previously mentioned package, a rigid PCB, a semi-rigid PCB, flexible PCB, or any other substrate, in order to have the device surface flush with the substrate surface. The device membrane maybe hermetically or semi-hermetically sealed with a gas (e.g. air, dry air, argon, nitrogen, xenon or any other gas) or a liquid, to engineer the thermo-mechanical properties of the device. The device may also be packaged in a vacuum. The package can also be a chip or wafer level package, formed for example by wafer-bonding.

The sensor may have through silicon vias (TSV), to avoid the presence of bond wires in proximity of the sensitive area of the device which might affect the flow readings. Advantageously, a sensor with TSV can enable 3D stacking techniques. For instance the sensor chip can sit on top of an ASIC, thus reducing the sensor system size.

The flow sensor may be used in applications ranging from smart energy (e.g. HVAC, white goods, gas metering) and industrial automation (e.g. leakage testing, dispensing, analytic instruments) to medical (e.g. spirometry, capnometry, respirators, inhalers, drug delivery) and fluid dynamics research (e.g. turbulence measurements, flow attachment). Interestingly, this invention also enables application in harsh environments (ambient temperature from cryogenic regime up to 300° C.), such as boilers, automotive, space and others.

We disclose herein a method of manufacturing a CMOS-based sensor, the method comprising: forming at least one membrane on a substrate comprising an etched portion; forming a flow sensing device within the at least one membrane as well as a pressure sensing device within the at least one membrane.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
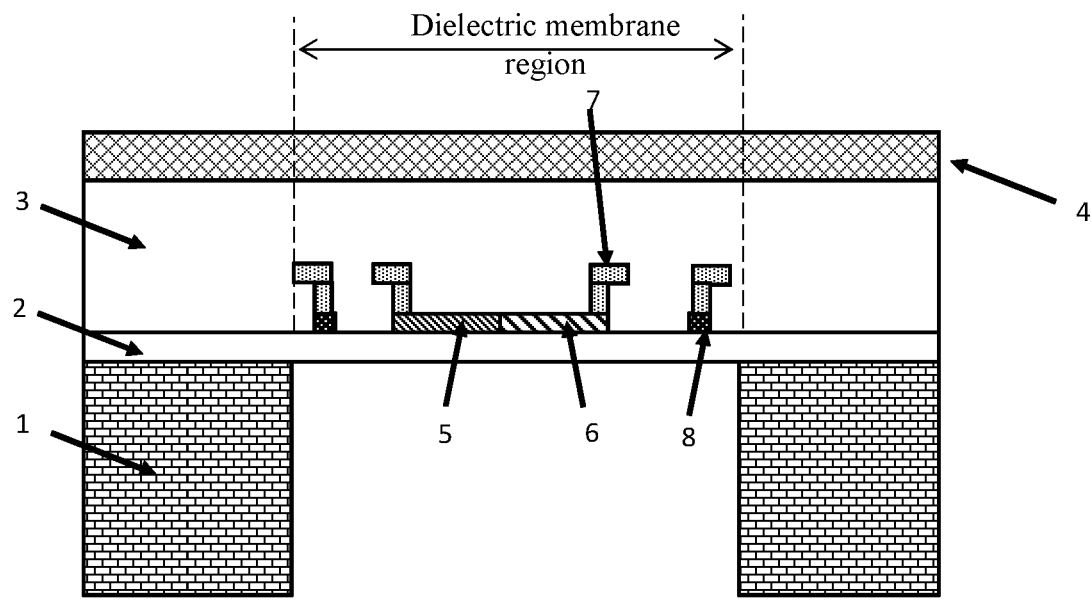
FIG. 1 shows a schematic cross-section of a SOI CMOS flow-pressure sensor, having a diode and two piezo-elements embedded within a portion of the substrate (i.e. a membrane region) etched by DRIE resulting in vertical sidewalls.

FIG. 1 shows a schematic cross section of a SOI CMOS flow-pressure sensor comprising: a substrate 1 comprising an etched portion obtained by dry etching and resulting in vertical sidewalls; a dielectric region located on the substrate comprising a first dielectric layer 2 (in a SOI process this is usually referred to as buried oxide layer, BOX), a second dielectric layer 3, and a passivation layer 4. The dielectric region located on the substrate also comprises a membrane over an area of the etched portion of the substrate. In FIG. 1, the membrane region is shown using two dashed-line boundaries within the dielectric region. The same definition applies in the remaining figures. The flow-pressure sensor also comprises a p-n junction type device formed within the dielectric membrane, wherein, in this example, the p-n junction type device is a diode and comprises a p region 5 and an n region 6. The diode is connected to metal tracks 7 for external access, and is configured to operate as a temperature sensing device. The diode can also be configured to operate as a heating element. The flow-pressure sensor also comprises piezo-elements 8 configured to operate as pressure sensing devices.

Figure 2:
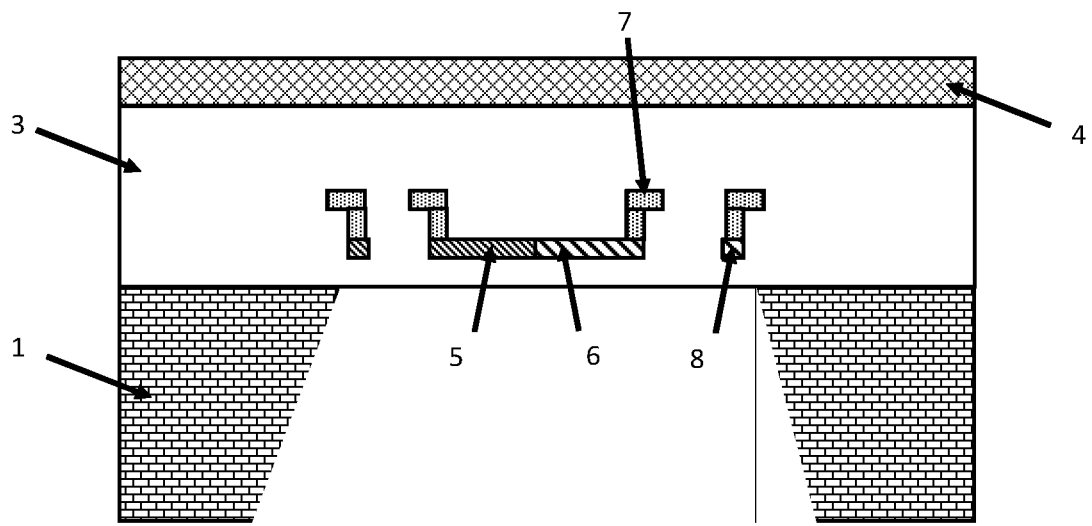
FIG. 2 shows a schematic cross-section of a CMOS flow sensor, having a diode and two piezo-elements embedded within or above a portion of the substrate (i.e. a membrane) etched by wet etching resulting in slanted sidewalls.

FIG. 2 shows a schematic cross section of a CMOS flow-pressure sensor comprising: a substrate 1 comprising an etched portion obtained by wet etching and resulting in slanted sidewalls; a dielectric region located on the substrate comprising a first dielectric layer 3, and a passivation layer 4. The dielectric region located on the substrate also comprises a membrane region over an area of the etched portion of the substrate. The flow sensor also comprises a p-n junction type device formed within the dielectric membrane, wherein the p-n junction type device is a diode and comprises a p region 5 and an n region 6. The diode is connected to metal tracks 7 for external access, and is configured to operate as a temperature sensing device. The diode can also be configured to operate as a heating element. The flow-pressure sensor also comprises piezo-elements 8 configured to operate as pressure sensing devices.

Figure 3:
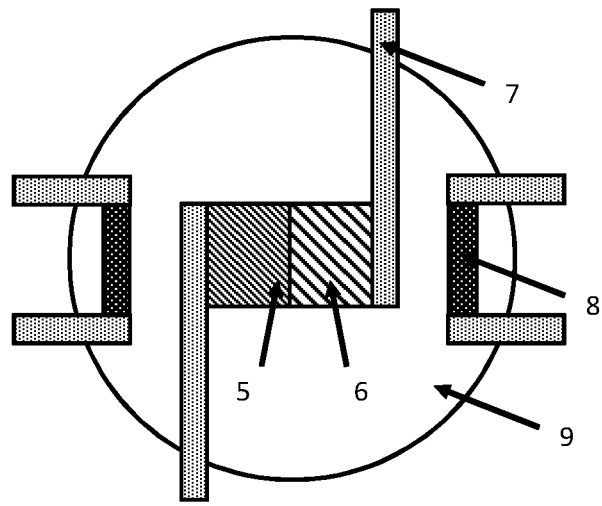
FIG. 3 shows a schematic top view of a rectangular diode and two rectangular piezo-elements (piezo-resistors in this case) embedded within a circular membrane.

FIG. 3 shows a schematic top view of a rectangular diode comprising a p region 5 and an n region 6 embedded within a circular membrane region 9. The membrane region 9 is the entire area within the perimeter of the circle. The diode is connected to metal tracks 7 for external access, and is configured to operate as a temperature sensing device. The diode can also be configured to operate as a heating element. The membrane region 9 also comprises rectangular piezo-elements 8 configured to operate as pressure sensing devices.

Figure 4:
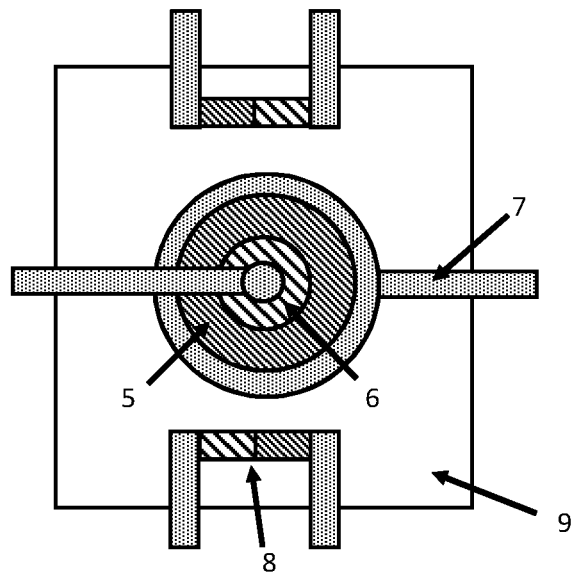
FIG. 4 shows a schematic top view of a circular diode and two rectangular piezo-elements (piezo-diodes in this case) embedded within a square membrane.

FIG. 4 shows a schematic top view of a circular diode comprising a p region 5 and an n region 6 embedded within a square membrane 9. In this example, the membrane region 9 is the entire area within the square. The diode is connected to metal tracks 7 for external access, and is configured to operate as a temperature sensing device. The diode can also be configured to operate as a heating element. The membrane region also comprises rectangular piezo-elements 8 configured to operate as pressure sensing devices. The piezo-elements are piezo-diodes.

Figure 5:
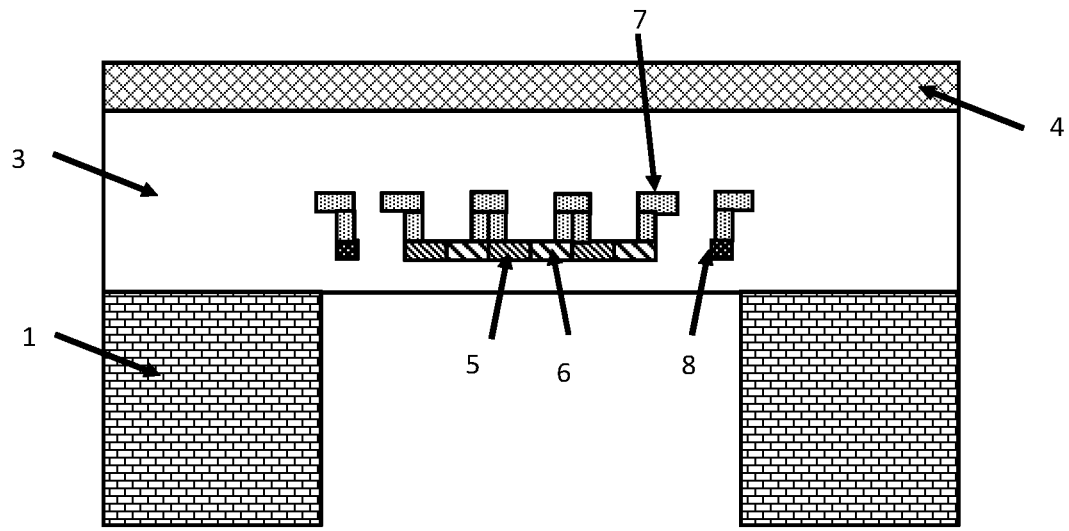
FIG. 5 shows a schematic cross-section of a CMOS flow-pressure sensor, having three diodes in series and two piezo-elements embedded within a membrane.

FIG. 5 shows a schematic cross section of a CMOS flow-pressure sensor comprising: a substrate 1 comprising an etched portion obtained by dry etching and resulting in vertical sidewalls; a dielectric region located on the substrate comprising a first dielectric layer 3, and a passivation layer 4. The dielectric region located on the substrate also comprises a membrane region over an area of the etched portion of the substrate. The flow-pressure sensor also comprises a p-n junction type device formed within the dielectric membrane, wherein the p-n junction type device is an array of three diodes in series, each diode comprising a p region 5 and an n region 6. The array of diodes is connected to metal tracks 7 for external access, and is configured to operate as a temperature sensing device. The array of diodes can also be configured to operate as heating elements. The flow-pressure sensor also comprises piezo-elements 8 configured to operate as pressure sensing devices.

Figure 6:
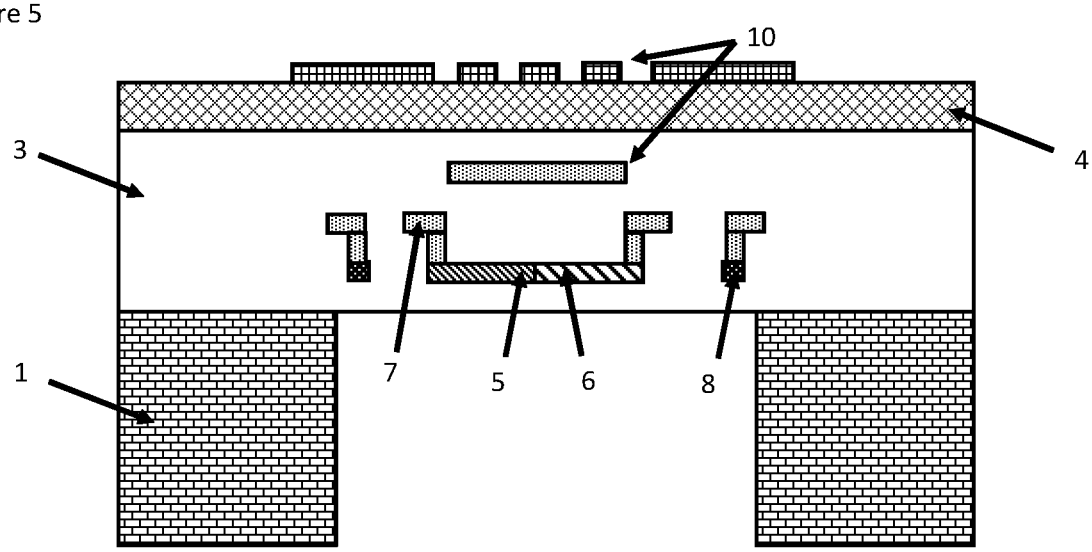
FIG. 6 shows a schematic cross-section of a CMOS flow-pressure sensor, having a diode and two piezo-elements embedded within a membrane as well as additional structures within and above the dielectric region.

FIG. 6 shows a schematic cross section of a CMOS flow-pressure sensor comprising: a substrate 1 comprising an etched portion obtained by dry etching and resulting in vertical sidewalls; a dielectric region located on the substrate comprising a first dielectric layer 3, and a passivation layer 4. The dielectric region located on the substrate also comprises a membrane over an area of the etched portion of the substrate. The flow-pressure sensor also comprises a p-n junction type device formed within the dielectric membrane, wherein the p-n junction type device is a diode and comprises a p region 5 and an n region 6. The diode is connected to metal tracks 7 for external access, and is configured to operate as a temperature sensing device. The diode can also be configured to operate as a heating element. The flow-pressure sensor also comprises piezo-elements 8 configured to operate as pressure sensing devices. The flow-pressure sensor also comprises additional structures 10 within and above the dielectric region located on the substrate to engineer the thermo-mechanical properties (e.g. stiffness, temperature profile distribution, etc.) of the dielectric region and/or the fluid dynamic interaction between the fluid and the dielectric region.

Figure 7:
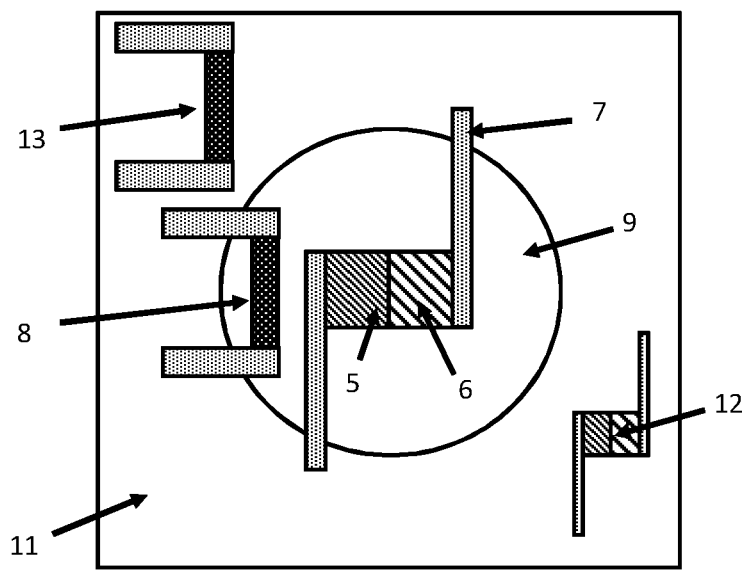
FIG. 7 shows a schematic top view of a CMOS flow-pressure sensor chip, having a diode and a piezo-element embedded within a membrane region as well as a reference diode and a reference piezo-element on the substrate.

FIG. 7 shows a schematic top view of a flow sensor chip 11 comprising a rectangular diode comprising a p region 5 and an n region 6 embedded within a circular membrane 9. The diode is connected to metal tracks 7 for external access, and is configured to operate as a temperature sensing device. The diode can also be configured to operate as heating element. The membrane also comprises a rectangular piezo-element 8 configured to operate as pressure sensing device. The flow-pressure sensor chip 11 also comprises a reference p-n junction type device 12, and a reference piezo-element 13 outside the membrane 9. The reference p-n junction type device 12 and the reference piezo-element 13 can be used to measure the substrate/case/ambient temperature for compensation purposes. Any of the p-n junction type devices can also be part of a more complex temperature sensing circuit, such as a VPTAT (voltage proportional to absolute temperature) or IPTAT (current proportional to absolute temperature). Also any of the piezo-elements can be part of a more complex pressure sensing circuit, such as a Wheatstone bridge.

Figure 8:
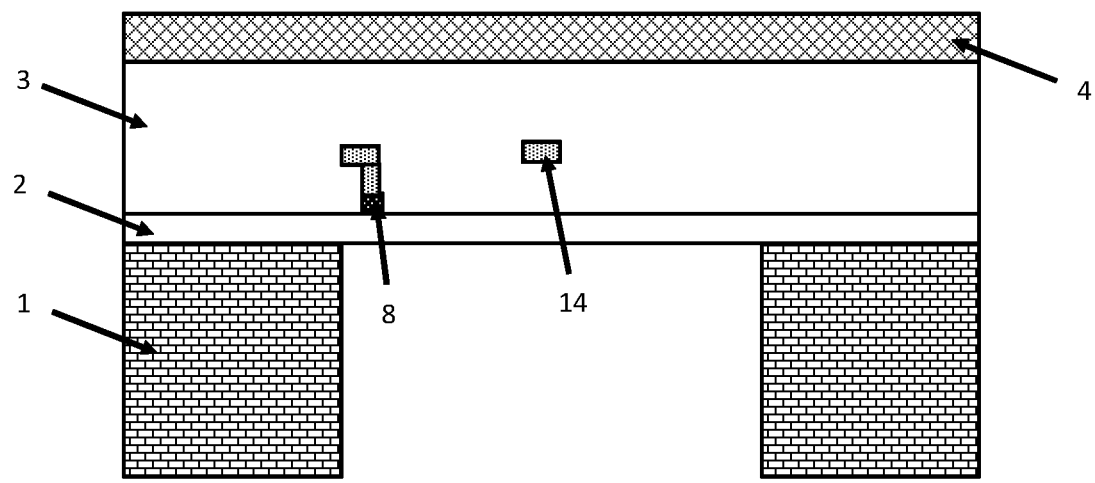
FIG. 8 shows a schematic cross-section of a SOI CMOS flow-pressure sensor, having a heating element and a piezo-element embedded within a membrane.

FIG. 8 shows a schematic cross section of a SOI CMOS flow-pressure sensor comprising: a substrate 1 comprising an etched portion obtained by dry etching and resulting in vertical sidewalls; a dielectric region located on the substrate comprising a first dielectric layer 2 (in a SOI process this is usually referred to as buried oxide layer, BOX), a second dielectric layer 3, and a passivation layer 4. The dielectric region located on the substrate also comprises a membrane region over an area of the etched portion of the substrate. The flow-pressure sensor also comprises a resistor 14 formed within the dielectric membrane, wherein the resistor is configured to operate as a heating element. The flow-pressure sensor also comprises a piezo-element 8 configured to operate as a pressure sensing device.

Figure 9:
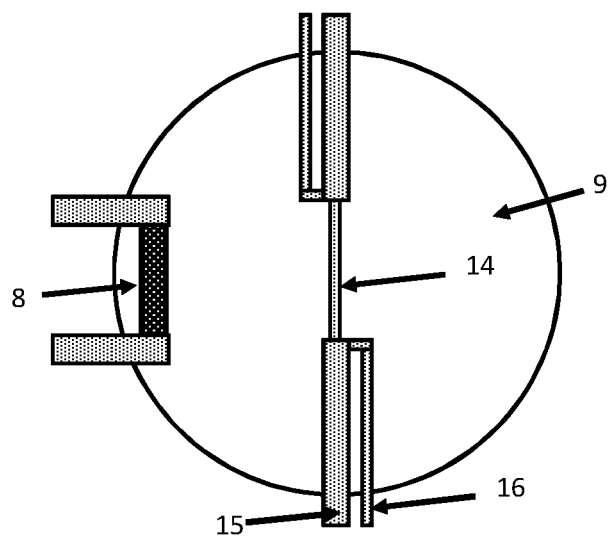
FIG. 9 shows a schematic top view of a wire-type heating element and a piezo-element embedded within a membrane.

FIG. 9 shows a schematic top view of a wire-type resistor 14 embedded within a circular membrane 9, wherein the resistor is configured to operate as a heating element. The resistor 14 is connected to metal tracks for external access, wherein the tracks are configured to allow 4-wires type measurement of the resistor 14 resistance and comprise amperometric tracks 15 and voltammetric tracks 16. The membrane 9 also comprises a rectangular piezo-element 8 configured to operate as a pressure sensing device.

Figure 10:
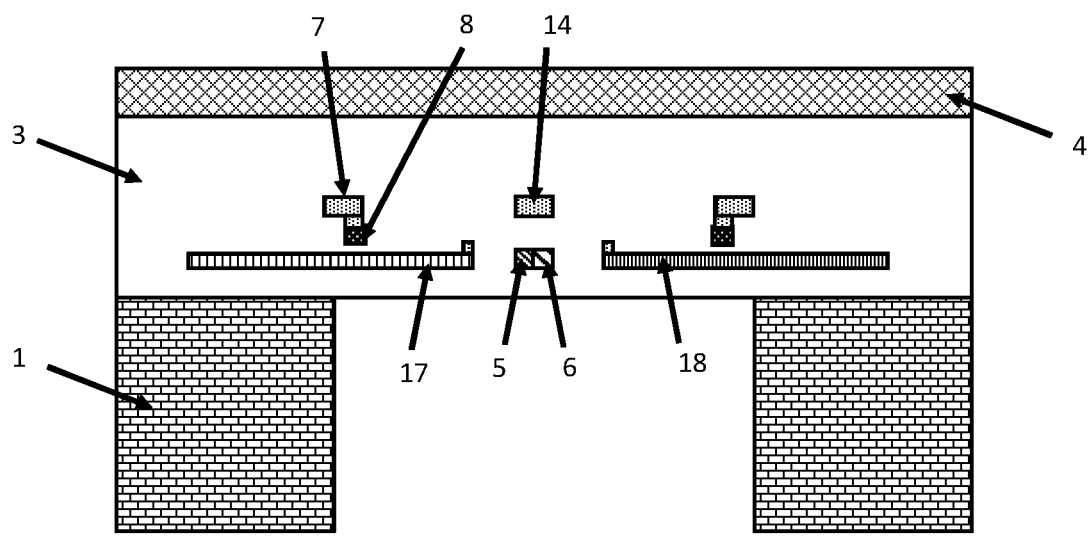
FIG. 10 shows a schematic cross-section of a CMOS flow-pressure sensor, having a diode embedded within a membrane underneath a heating element along with thermocouples and two piezo-elements.

FIG. 10 shows a schematic cross section of a CMOS flow-pressure sensor comprising: a substrate 1 comprising an etched portion obtained by dry etching and resulting in vertical sidewalls; a dielectric region located on the substrate comprising a first dielectric layer 3, and a passivation layer 4. The dielectric region located on the substrate also comprises a membrane over an area of the etched portion of the substrate. The flow-pressure sensor also comprises a p-n junction type device formed within the dielectric membrane, wherein the p-n junction type device is a diode and comprises a p region 5 and an n region 6. The diode is configured to operate as a temperature sensing device. The flow-pressure sensor also comprises a resistor 14 formed within the dielectric membrane region, wherein the resistor is configured to operate as a heating element. The flow-pressure sensor also comprises thermopiles 17 and 18 used as additional temperature sensing elements. A thermopile comprises one or more thermocouples connected in series. Each thermocouple comprises two dissimilar materials which form a junction at a first region of the membrane, while the other ends of the materials form a junction in the heat sink region (substrate outside the membrane area), where they are connected electrically to the adjacent thermocouple or to pads for external readout. The flow-pressure sensor also comprises piezo-elements 8 configured to operate as pressure sensing device and connected to metal tracks 7 for external access.

Figure 11:
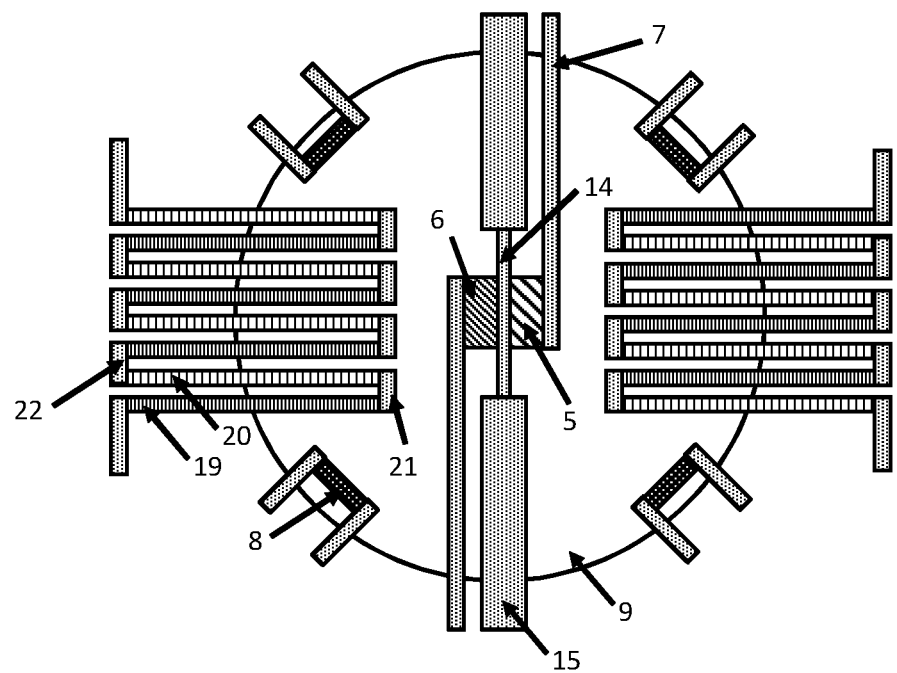
FIG. 11 shows a schematic top view of a diode embedded within a membrane underneath a heating element along with two thermopiles with reference junctions on the substrate, wherein four piezo-elements are also embedded within the membrane region.

FIG. 11 shows a schematic top view of a rectangular diode comprising a p region 5 and an n region 6 embedded within a circular membrane 9. The diode is connected to metal tracks 7 for external access, and is configured to operate as a temperature sensing device. The membrane 9 also comprises a resistor 14, wherein the resistor is configured to operate as a heating element. The resistor 14 is connected to metal tracks 15 for external access. The membrane 9 also comprises thermopiles used as additional temperature sensing elements. A thermopile comprises one or more thermocouples connected in series. Each thermocouple comprises two dissimilar materials 19 and 20 which form a junction 21 at a first region of the membrane, while the other ends of the materials form a junction 22 in the heat sink region (substrate outside the membrane area), where they are connected electrically to the adjacent thermocouple or to pads for external readout. The membrane 9 also comprises rectangular piezo-elements 8 configured to operate as pressure sensing devices.

Figure 12:
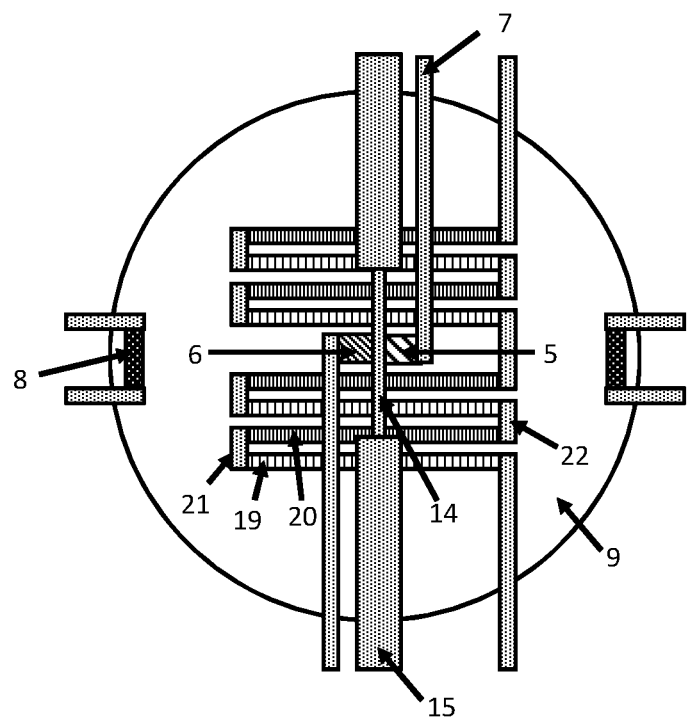
FIG. 12 shows a schematic top view of a diode embedded within a membrane region underneath a heating element along with a thermopile with both junctions within the membrane region wherein four piezo-elements are also embedded within the membrane region.

FIG. 12 shows a schematic top view of a rectangular diode comprising a p region 5 and an n region 6 embedded within a circular membrane 9. The diode is connected to metal tracks 7 for external access, and is configured to operate as a temperature sensing device. The membrane 9 also comprises a resistor 14, wherein the resistor is configured to operate as a heating element. The resistor 14 is connected to metal tracks 15 for external access. The membrane 9 also comprises a thermopile used as additional temperature sensing element. A thermopile comprises one or more thermocouples connected in series. Each thermocouple comprises two dissimilar materials 19 and 20 which form a junction 21 at a first region of the membrane, while the other ends of the materials form a junction 22 at a second region of the membrane, where they are connected electrically to the adjacent thermocouple or to pads for external readout. The membrane 9 also comprises rectangular piezo-elements 8 configured to operate as pressure sensing devices.

Figure 13:
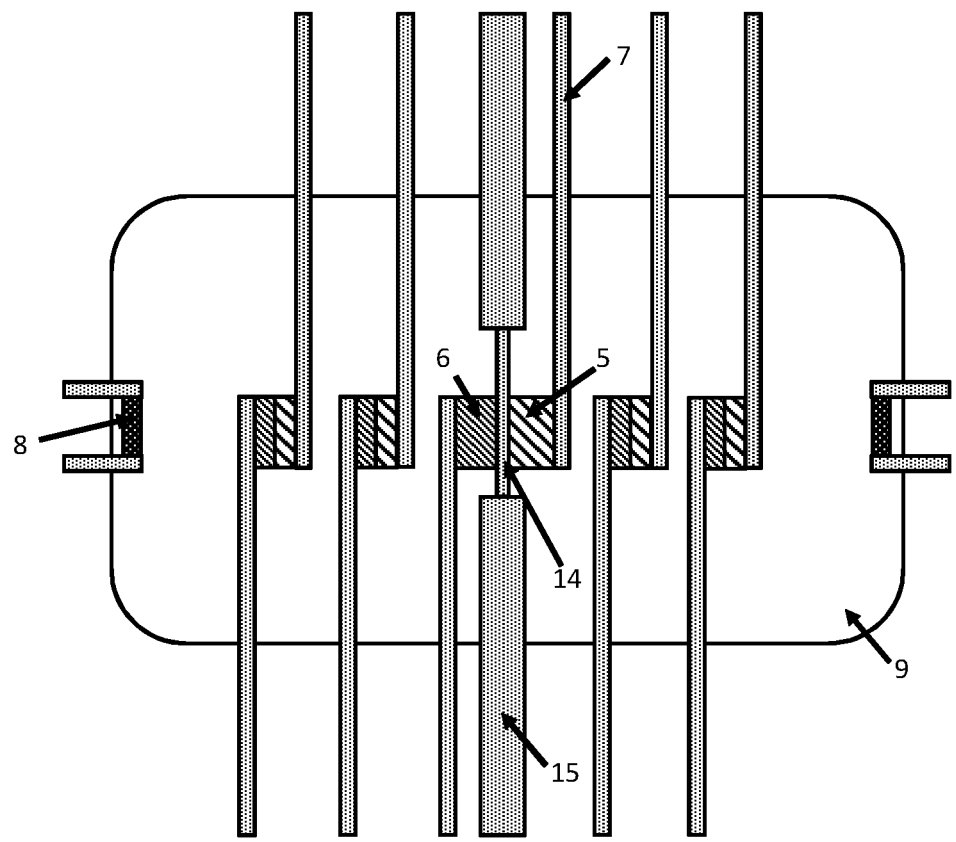
FIG. 13 shows a schematic top view of a diode embedded within a membrane region underneath a heating element along with four additional diodes and two piezo-elements.

FIG. 13 shows a schematic top view of a rectangular diode comprising a p region 5 and an n region 6 embedded within a rectangular membrane 9 with rounded corners. The diode is connected to metal tracks 7 for external access, and is configured to operate as a temperature sensing device. The membrane 9 also comprises a resistor 14, wherein the resistor is configured to operate as a heating element. The resistor 14 is connected to metal tracks 15 for external access. The membrane also comprises additional p-n junction type devices formed within the membrane 9, wherein the p-n junction types device are diodes configured to operate as additional temperature sensing devices. The membrane 9 also comprises rectangular piezo-elements 8 configured to operate as pressure sensing devices.

Figure 14:
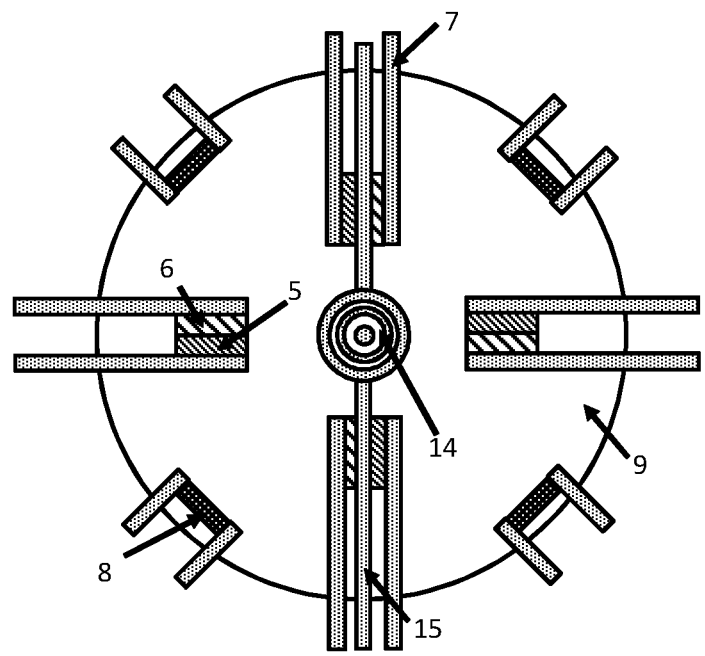
FIG. 14 shows a schematic top view of a multi ring type heating element within a membrane region along with four additional diodes and four piezo-elements.

FIG. 14 shows a schematic top view of four diodes, each comprising a p region 5 and an n region 6 embedded within a circular membrane 9. The diodes are connected to metal tracks 7 for external access, and are configured to operate as temperature sensing devices. The membrane 9 also comprises a multi ring-type resistor 14, wherein the resistor is configured to operate as a heating element. The resistor 14 is connected to metal tracks 15 for external access. The membrane 9 also comprises rectangular piezo-elements 8 configured to operate as pressure sensing devices.

Figure 15:
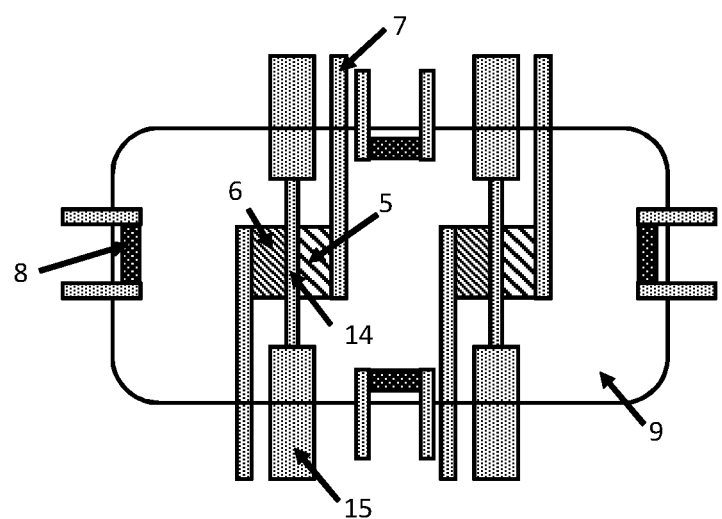
FIG. 15 shows a schematic top view of two diodes embedded within a membrane, each underneath a heating element, wherein four piezo-elements are also embedded within the membrane region.

FIG. 15 shows a schematic top view of two rectangular diodes, each comprising a p region 5 and an n region 6 embedded within a rectangular membrane 9 with rounded corners. The diodes are connected to metal tracks 7 for external access, and are configured to operate as temperature sensing devices. The membrane 9 also comprises two resistors 14, wherein the resistors are configured to operate as heating elements. The resistors 14 are connected to metal tracks 15 for external access. The membrane 9 also comprises rectangular piezo-elements 8 configured to operate as pressure sensing devices.

Figure 16:
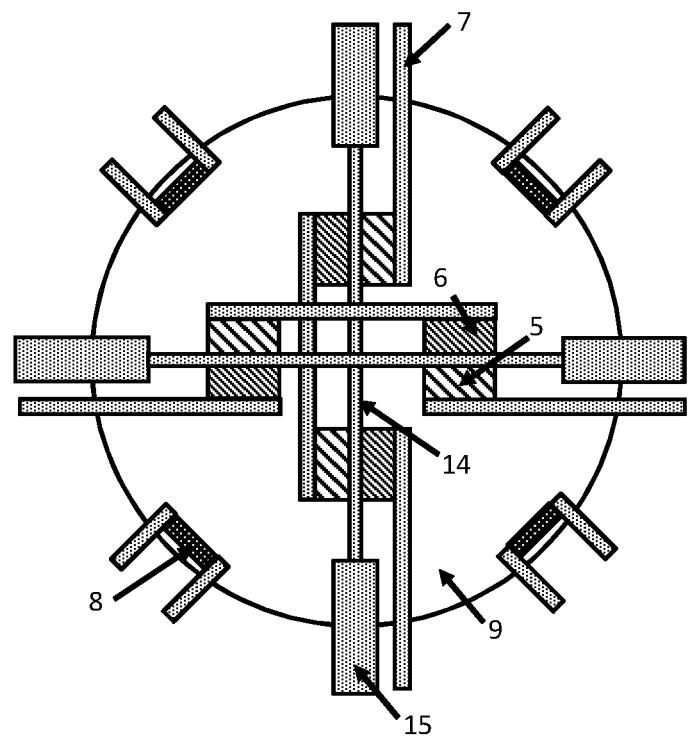
FIG. 16 shows a schematic top view of two arrays of diodes embedded within a membrane, each located underneath a heating element in a cross-like arrangement, wherein four piezo-elements are also embedded within the membrane.

FIG. 16 shows a schematic top view of two arrays of diodes, each formed by two rectangular diodes, each comprising a p region 5 and an n region 6 embedded within a circular membrane 9 in a cross-like arrangement. The diodes are connected to metal tracks 7 for external access, and are configured to operate as temperature sensing devices. The membrane 9 also comprises two resistors 14 in a cross-like arrangement, wherein the resistors are configured to operate as heating elements. The resistors 14 are connected to metal tracks 15 for external access. The membrane 9 also comprises rectangular piezo-elements 8 configured to operate as pressure sensing devices.

Figure 17:
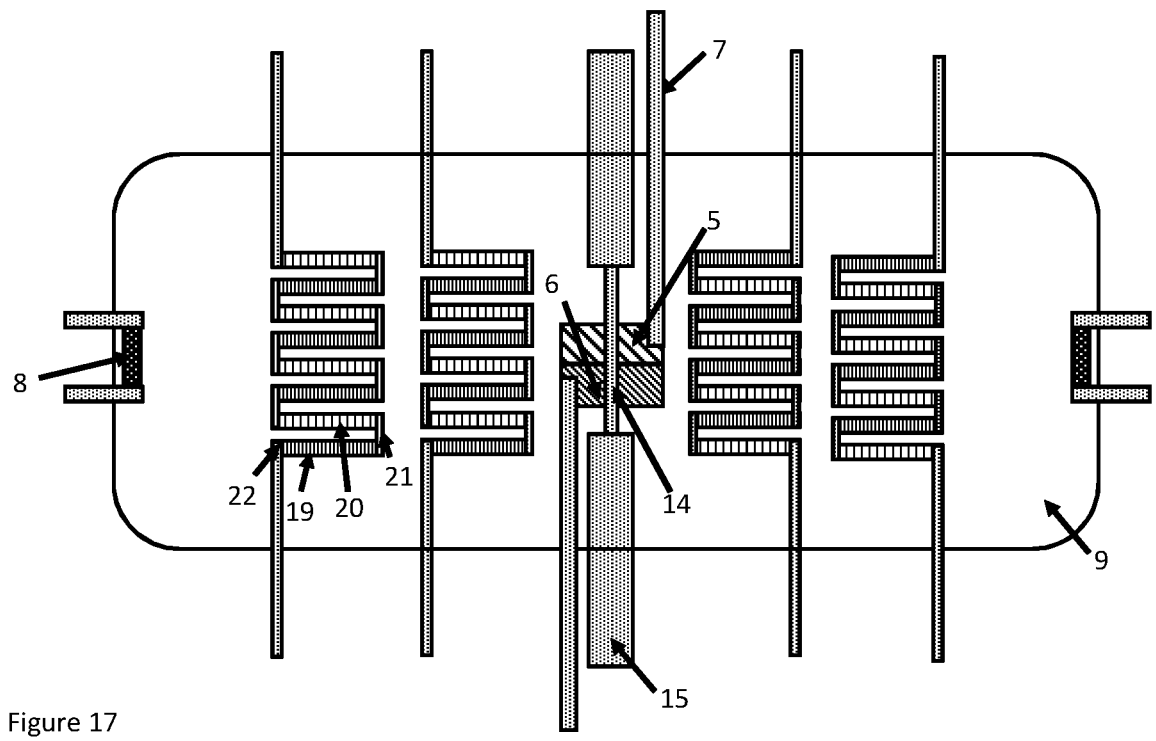
FIG. 17 shows a schematic top view of a diode embedded within a membrane underneath a heating element along with four additional thermopiles, wherein two piezo-elements are also embedded within the membrane.

FIG. 17 shows a schematic top view of a rectangular diode comprising a p region 5 and an n region 6 embedded within a rectangular membrane 9 with rounded corners. The diode is connected to metal tracks 7 for external access, and is configured to operate as a temperature sensing device. The membrane 9 also comprises a resistor 14, wherein the resistor is configured to operate as a heating element. The resistor 14 is connected to metal tracks 15 for external access. The membrane region also comprises thermopiles used as additional temperature sensing elements. A thermopile comprises one or more thermocouples connected in series. Each thermocouple comprises two dissimilar materials 19 and 20 which form a junction 21 at a first region of the membrane, while the other ends of the materials form a junction 22 at a second region of the membrane, where they are connected electrically to the adjacent thermocouple or to pads for external readout. The membrane 9 also comprises rectangular piezo-elements 8 configured to operate as pressure sensing devices.

Figure 18:
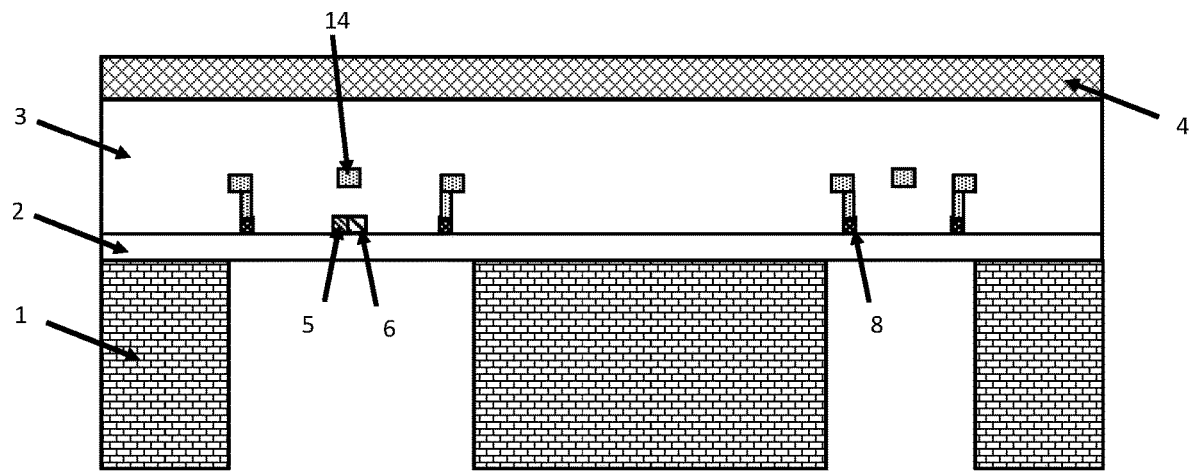
FIG. 18 shows a schematic cross-section of a double membrane CMOS flow-pressure sensor chip.

FIG. 18 shows a schematic cross section of a SOI CMOS flow-pressure sensor comprising: a substrate 1 comprising two etched portions obtained by dry etching and resulting in vertical sidewalls; a dielectric region located on the substrate comprising a first dielectric layer 2, a second dielectric layer 3, and a passivation layer 4. The dielectric region located on the substrate also comprises two membranes over an area of the etched portions of the substrate. The flow-pressure sensor also comprises a p-n junction type device formed within a first dielectric membrane, wherein the p-n junction type device is a diode and comprises a p region 5 and an n region 6. The diode is configured to operate as a temperature sensing device. The flow-pressure sensor also comprises a resistor 14 formed within the first dielectric membrane, wherein the resistor is configured to operate as a heating element. The flow-pressure sensor also comprises a resistor formed within a second dielectric membrane, wherein the resistor is configured to operate as a heating element. The flow-pressure sensor also comprises piezo-elements 8 formed within the first membrane and the second membrane, wherein the piezo-elements are piezo-resistors configured to operate as pressure sensing devices.

Figure 19:
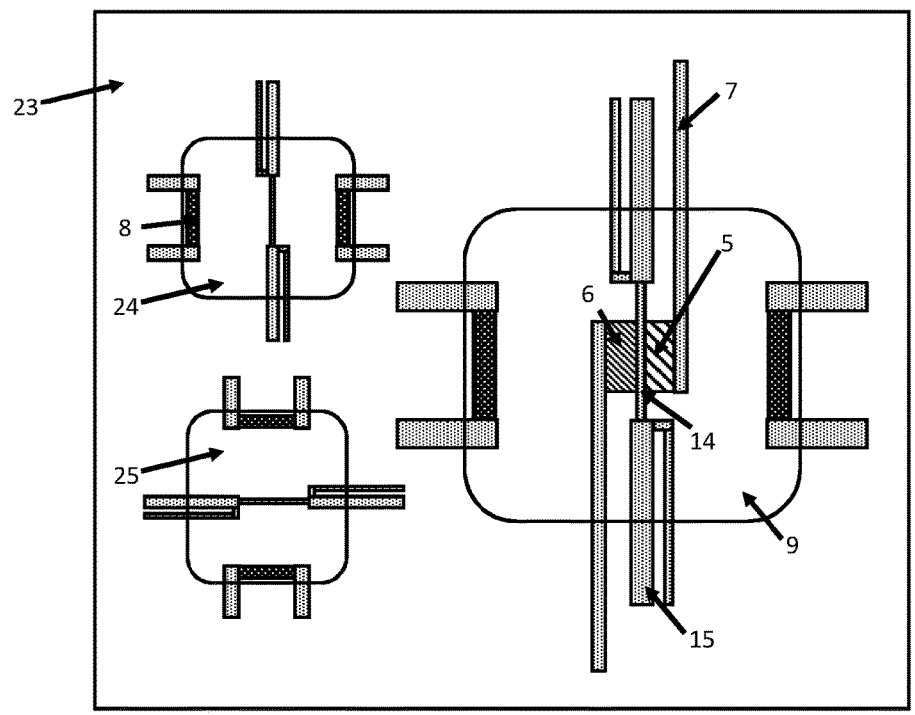
FIG. 19 shows a schematic top view of a triple membrane CMOS flow-pressure sensor chip.

FIG. 19 shows a schematic top view of a triple membrane CMOS flow-pressure sensing chip 23. The chip 23 comprises a first rectangular diode comprising a p region 5 and an n region 6 embedded within a first square membrane 9 with rounded corners. The diode is connected to metal tracks 7 for external access, and is configured to operate as a temperature sensing device. The membrane 9 also comprises a resistor 14, wherein the resistor is configured to operate as a heating element. The resistor 14 is connected to metal tracks 15 for external access. The membrane 9 also comprises piezo-elements 8 formed within the membrane 9, wherein the piezo-elements are piezo-resistors configured to operate as pressure sensing devices. The chip 23 also comprises a second resistor embedded within a second square membrane 24 with rounded corners and configured to operate as a heating element. The membrane 24 also comprises piezo-elements 8 formed within the second membrane 24, wherein the piezo-elements are piezo-resistors configured to operate as pressure sensing devices. The chip 23 also comprises a third resistor embedded within a third square membrane 25 with rounded corners and configured to operate as a heating element. The membrane 25 also comprises piezo-elements formed within the third membrane 25, wherein the piezo-elements are piezo-resistors configured to operate as pressure sensing devices.

Figure 20:
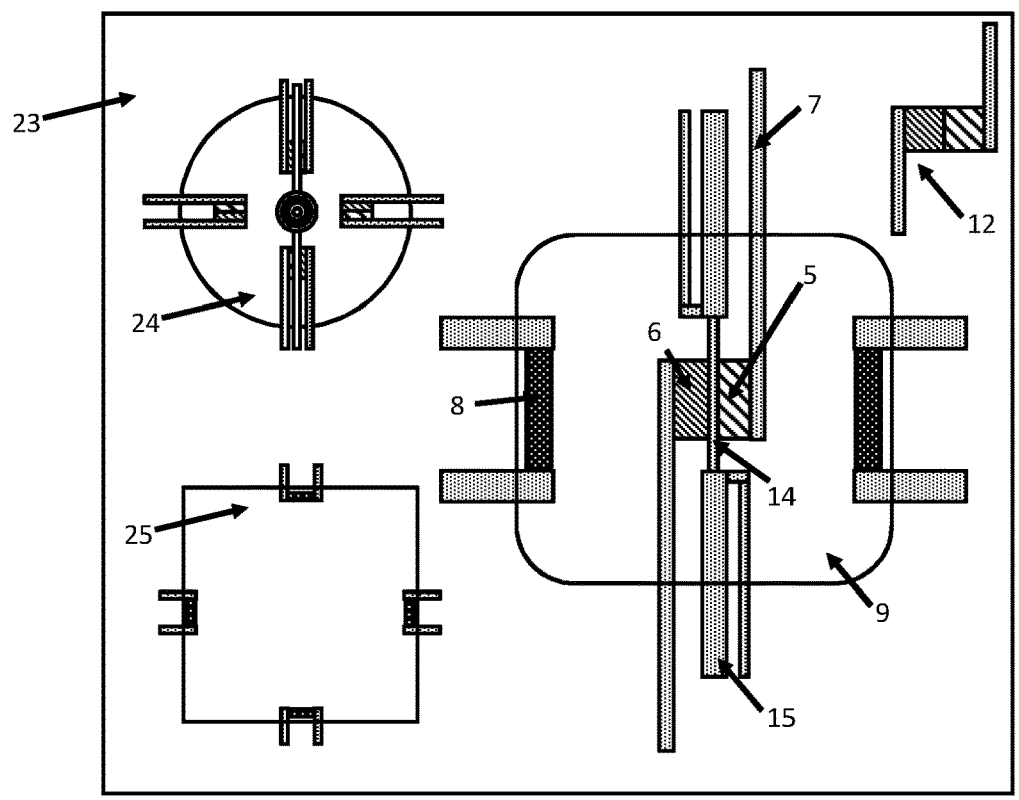
FIG. 20 shows a schematic top view of a triple membrane CMOS flow-pressure sensor chip, having a reference diode on the substrate.

FIG. 20 shows a schematic top view of a triple membrane CMOS flow-pressure sensing chip 23. The chip 23 comprises a first rectangular diode comprising a p region 5 and an n region 6 embedded within a first square membrane 9 with rounded corners. The diode is connected to metal tracks 7 for external access, and is configured to operate as a temperature sensing device. The membrane 9 also comprises a wire-type resistor 14, wherein the resistor is configured to operate as a heating element. The resistor 14 is connected to metal tracks 15 for external access. The membrane 9 also comprises piezo-elements 8 formed within the membrane 9, wherein the piezo-elements are piezo-resistors configured to operate as pressure sensing devices. The chip 23 also comprises a second resistor (multi-ring type) embedded within a second circular membrane 24 configured to operate as a heating element. The membrane 24 also comprises p-n junction type devices formed within the second membrane 24, wherein the p-n junction type devices are diodes configured to operate as temperature sensing devices. The chip 23 also comprises a third square membrane 25 comprising piezo-elements formed within the third membrane 25, wherein the piezo-elements are piezo-resistors configured to operate as pressure sensing devices. The chip 23 also comprises a reference p-n junction type device 12 outside the membranes 9, 24, and 25. The reference p-n junction type device 12 can be a diode and used to measure the substrate/case/ambient temperature for compensation purposes.

Figure 21:
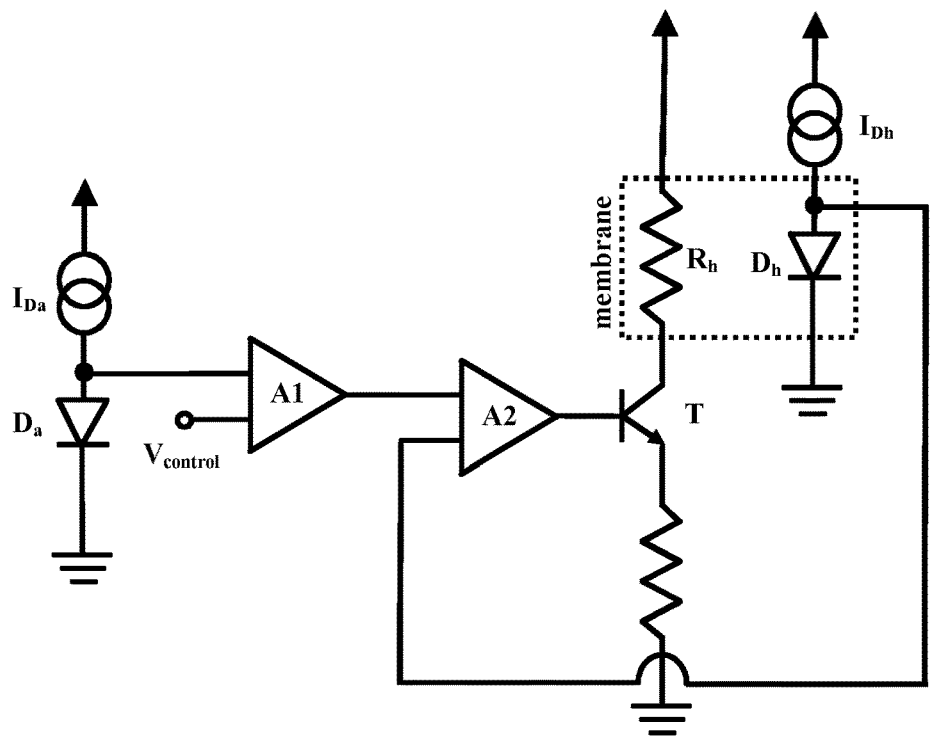
FIG. 21 is an example of circuit implementing Constant Temperature Difference driving method using diodes for a thermal feedback.

FIG. 21 is an example of circuit implementing Constant Temperature Difference driving method using diode $D_h$, driven with the current generator $I_{Dh}$, to obtain a thermal feedback of the temperature of the heating resistor $R_h$ and using diode $D_a$, driven with the current generator $I_{Da}$, to obtain a thermal feedback of the substrate/case/ambient for compensation purposes. The operating temperature of the heating resistor $R_h$ is set through the signal $V_{control}$. The current in the resistor $R_h$ is controlled with the transistor T, having its gate controlled by the output signal of the amplifier A2. This circuit could be monolithically integrated on the sensor chip.

Figure 22:
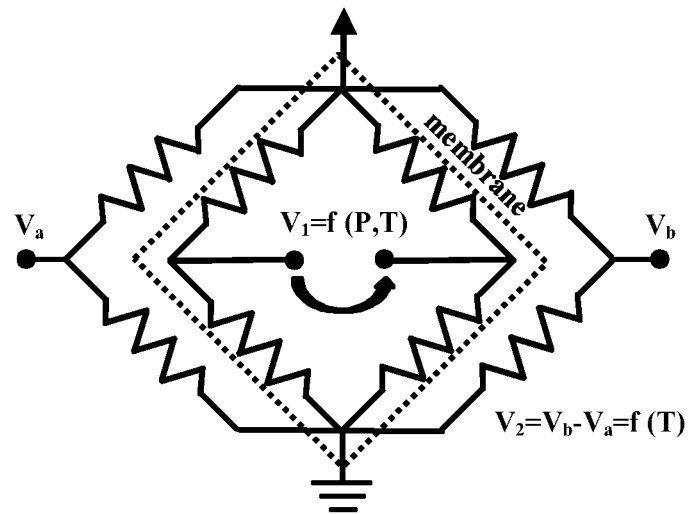
FIG. 22 is an example of double Wheatstone bridge circuit for temperature-compensated pressure measurements.

FIG. 22 is an example of circuit used to readout from the piezo-elements, wherein the piezo-elements are piezo-resistors. A first Weathstone bridge is formed connecting the piezo-resistors embedded within the membrane, and a second Weathstone bridge is formed connecting the piezo-resistors outside the membrane area. The first and the second bridge share the supply voltage and the ground. A first output V1 will be function of both temperature and pressure. A second output V2=Vb−Va will be only function of temperature. By coupling the first output V1 and the second output V2 it is possible to obtain a temperature compensated signal. This circuit could be monolithically integrated on the sensor chip.

Figure 23:
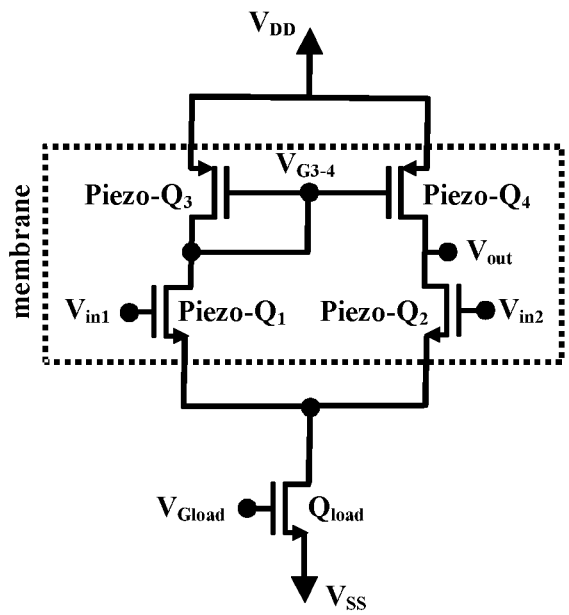
FIG. 23 is an example of pressure sensitive differential amplifier circuit using piezo-MOSFETs as piezo-elements.

FIG. 23 is an example of circuit used to readout from piezo-elements, wherein the piezo-elements are piezo-transistors. The piezo-transistors Q1, Q2, Q3 and Q4 are embedded within the membrane and connected to form a differential amplifier. The output Vout will be function of pressure. This circuit could be monolithically integrated on the sensor chip.

Figure 24:
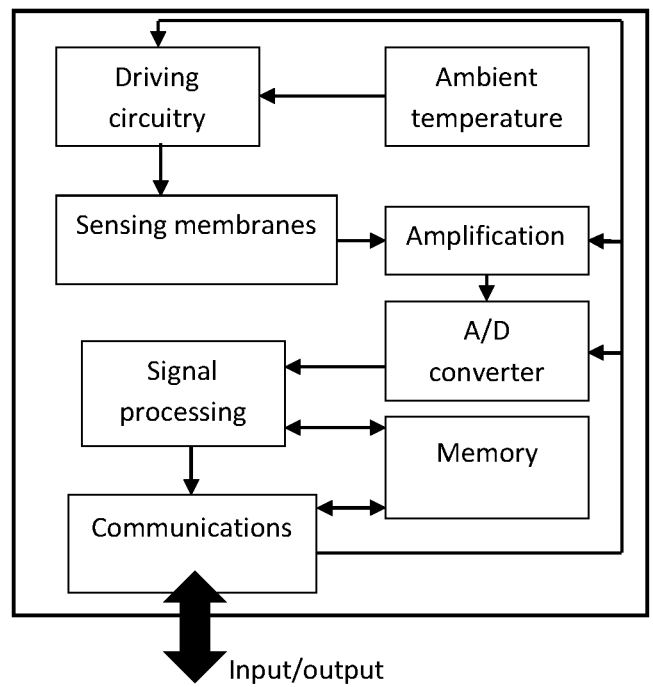
FIG. 24 is an example of circuital blocks that could be monolithically integrated on-chip.

FIG. 24 is an example of circuital blocks that could be monolithically integrated on chip. These blocks include but are not limited to: driving circuital blocks, to drive the heating element and/or the sensing elements; substrate/case/ambient temperature sensing circuital blocks, that can be used as input to the driving circuital blocks, as shown in FIG. 21, FIG. 22 and FIG. 23; membranes comprising any of the sensing structures disclosed in the preferred embodiments; amplification circuital blocks to manipulate the analog outputs of the sensing structures, the amplification circuital blocks may include amplifiers as well as filters for noise reduction or any other means to manipulate analog signals; analog to digital converters to allow digital processing, storage and communication of the sensing structures output. The circuital blocks can also receive data from the outside world, allowing remote control over amplification parameters, A/D conversion, driving and data stored in memory. Other circuital blocks might be included as well, such as multiplexers and demultiplexer to select one among the many available sensing structures on chip; switches might also be integrated to switch on/off some or all circuital blocks and thus reducing power consumption.

Figure 25:
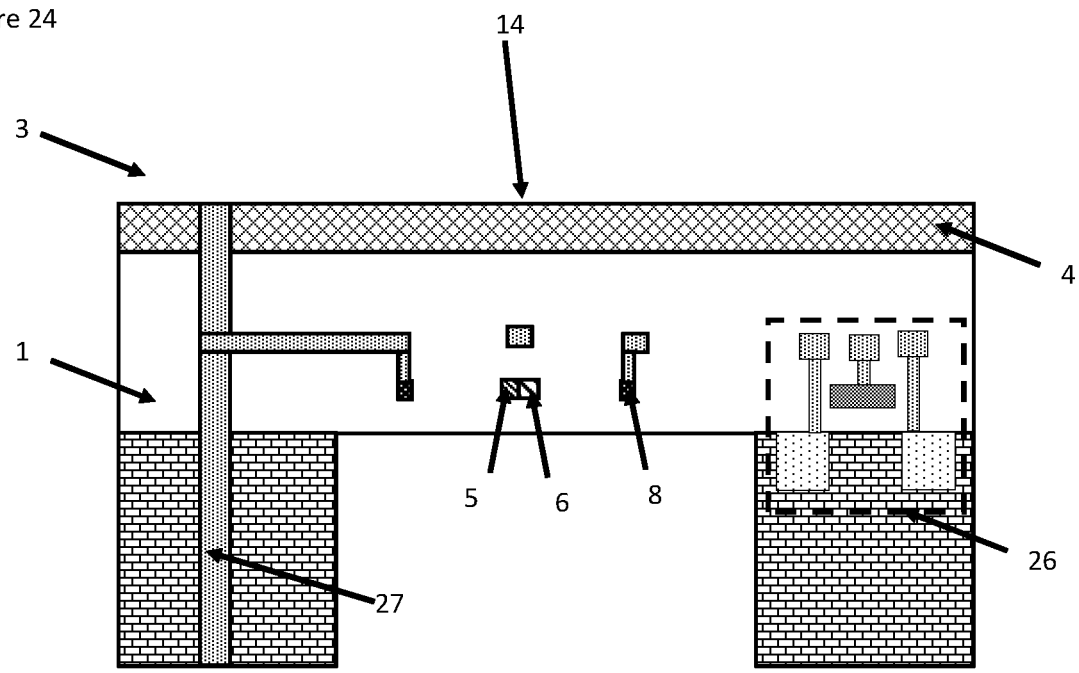
FIG. 25 shows a schematic cross-section of a CMOS flow sensor, having: a diode, a heating element and two piezo-elements embedded within a membrane; circuits integrated on-chip; and through silicon vias (TSV)

FIG. 25 shows a schematic cross section of a CMOS flow-pressure sensor comprising: a substrate 1 comprising an etched portion obtained by dry etching and resulting in vertical sidewalls; a dielectric region located on the substrate comprising a first dielectric layer 3, and a passivation layer 4. The dielectric region located on the substrate also comprises a membrane over an area of the etched portion of the substrate. The flow-pressure sensor also comprises a p-n junction type device formed within the dielectric membrane, wherein the p-n junction type device is a diode, comprising a p region 5 and an n region 6, and is configured to operate as a temperature sensing device. The flow-pressure sensor also comprises a resistor 14, wherein the resistor is configured to operate as heating element. The flow-pressure sensor also comprises some monolithically integrated electronics herein exemplified by a MOSFET 26. The flow sensor may also comprise Through Silicon Vias (TSV) 27, thus avoiding the presence of bonding wires that could affect the flow on the device surface.

Figure 26:
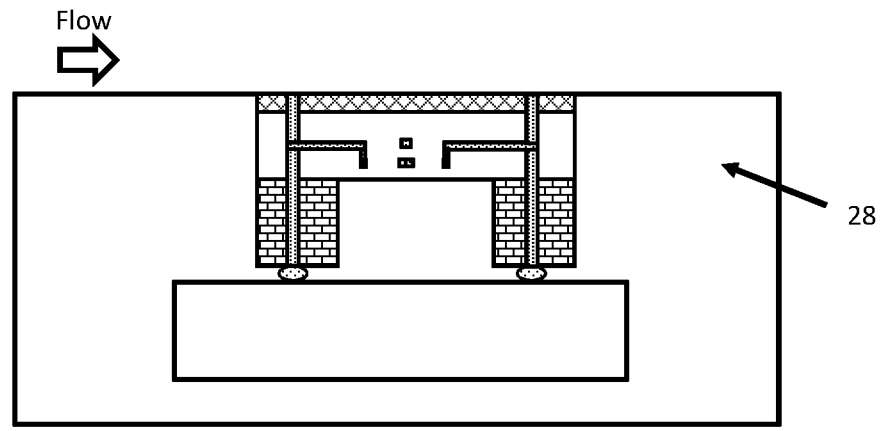
FIG. 26 is an example of flow-pressure sensor, 3D stacked on an ASIC embedded within a PCB, with its surface flush with the PCB surface.

FIG. 26 is an example of flow sensor, 3D stacked on an ASIC embedded within a PCB 28, with its surface flush with the PCB surface.

Figure 27:
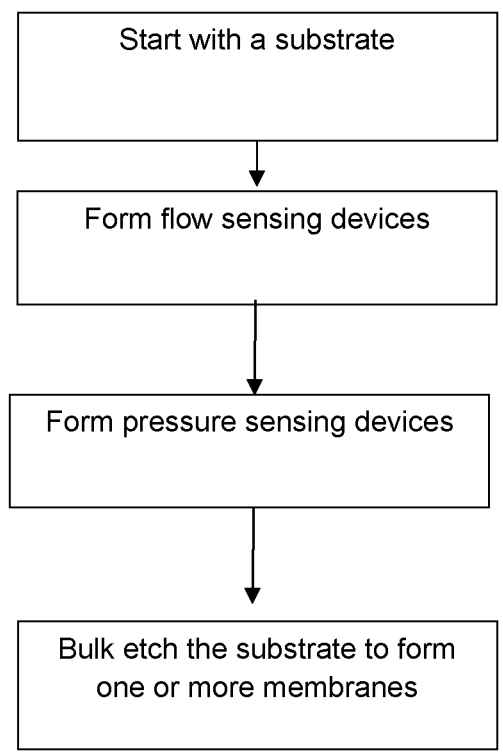
FIG. 27 illustrates an exemplary flow diagram outlining the manufacturing method of the sensor of the present specification.

FIG. 27 illustrates an exemplary flow diagram outlining the manufacturing method of the sensor of the present specification.

The skilled person will understand that in the preceding description and appended claims, positional terms such as 'above', 'overlap', 'under', 'lateral', etc. are made with reference to conceptual illustrations of an device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above may be reversed, the resulting devices still being in accordance with embodiments of the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A CMOS-based sensing device comprising:
   a substrate comprising an etched portion;
   a first region located on the substrate, wherein the first region comprises a first membrane region formed over an area of the etched portion of the substrate;
   a flow sensor formed within the first membrane region, the flow sensor being a temperature sensing device; and
   a pressure sensor formed within said first membrane region,
   wherein the flow sensor and the pressure sensor are located completely within the first membrane region.

2. The sensing device according to claim 1, wherein the first membrane region is an area located directly above the etched portion of the substrate and wherein the first membrane region is supported along its entire perimeter by the substrate.

3. The sensing device according to claim 1, wherein the flow sensor comprises a first p-n junction type device operating as the temperature sensing device.

4. The sensing device according to claim 3, wherein the first p-n junction type device comprises at least one diode or an array of diodes; or
wherein the first p-n junction type device comprises a transistor or an array of transistors, and wherein the transistor or the array of transistors each comprises a diode.

5. The sensing device according to claim 3, comprising a second p-n junction type device located outside the first membrane region, wherein the second p-n junction type device is configured to measure a substrate temperature of the sensor;
wherein the first p-n junction type device is operationally connected to a temperature sensing circuit, and wherein the temperature sensing circuit comprises any one of a voltage proportional to absolute temperature (VPTAT) and a current proportional to absolute temperature (IPTAT).

6. The sensing device according to claim 3, either:
wherein the first p-n junction type device is configured to operate as a heating element; or
further comprising a heating element within the first membrane region, wherein the first p-n junction type device is located underneath the heating element within the first membrane region having a relatively high increase in temperature.

7. The sensing device according to claim 6, wherein:
the heating element comprises a material comprising any one of:
n or p type single crystal silicon;
n or p type polysilicon;
tungsten, aluminium, titanium, silicides or any other metal or semi-conductive material available in a CMOS process; or
wherein the heating element comprises amperometric and voltammetric connections; or
comprising a further heating element which is configured to recalibrate the heating element within the first membrane region.

8. The sensing device according to claim 6, wherein the first p-n junction type device and the heating element are configured to operate in any one of a pulse mode and a continuous mode.

9. The sensing device according to claim 6, wherein the first p-n junction type device and/or the heating element is configured to increase temperature within the first membrane region, and
wherein the first p-n junction type device is configured to measure heat exchange between the first p-n junction type device and a fluid, and the p-n junction is configured to correlate the heat exchange to at least one property of the fluid so as to differentiate between forms of the fluid, and
wherein the property of the fluid comprises any one of velocity, flow rate, exerted wall shear stress, pressure, temperature, direction, thermal conductivity, diffusion coefficient, density, specific heat, and kinematic viscosity.

10. The sensing device according to claim 3, wherein either:
the first p-n junction type device is configured to operate in a forward bias mode in which a forward voltage across the first p-n junction type device decreases linearly with a temperature when operated at a constant forward current; or
wherein the first p-n junction type device is configured to operate in a reverse bias mode where a leakage current is exponentially dependent on a temperature.

11. The sensing device according to claim 3, further comprising one or more temperature sensing elements, and wherein said one or more temperature sensing elements comprise one or more thermopiles each comprising one or more thermocouples connected in series, and
wherein each thermocouple comprises two dissimilar materials which form a junction at a first region of the first membrane region, and the other ends of the materials form a junction at a second region of the first membrane region or in the heat sink region where they are electrically connected, wherein
the thermocouple comprises a material selected from any one of aluminium, tungsten, titanium, and a combination of these materials, and any other metal available in a CMOS process.

12. The sensing device according to claim 11, wherein:
one temperature sensing element is configured to use for flow sensing and another temperature sensing element is configured to recalibrate said one temperature sensing element; or
wherein when one temperature sensing element is configured to fail, another temperature sensing element is configured to replace said one temperature sensing element.

13. The sensing device according to claim 1, wherein the flow sensor comprises a resistor, and wherein the resistor is configured to operate as a heating element.

14. The sensing device according to claim 1, wherein the pressure sensor is a mechanical pressure sensor comprising at least one piezo-element formed within the first membrane region, wherein:
the piezo-element comprises a piezo-resistor, a piezo-diode, a piezo-transistor, and wherein the piezo-element is configured such that an electrical output is correlated to a mechanical displacement of the first membrane region under an applied pressure; and
the piezo-element is located in a region within the first membrane region having an increased sensitivity to stress; and
the piezo-element comprises a material comprising:
n-type doped, p-type doped or un-doped single crystal silicon,
n-type doped, p-type doped or un-doped polysilicon, or
a combination of silicon and polysilicon.

15. The sensing device according to claim 14, wherein:
the piezo-element is formed in a plurality of segments or arranged in an array form; or
further comprising a pressure sensing circuit comprising at least one said piezo-element; or
comprising further piezo-elements located outside the first membrane region, and wherein said further piezo-elements are configured to operate as temperature compensation devices, comprising:
a temperature compensation circuit comprising said further piezo-elements outside the first membrane region, and
wherein the temperature compensation circuit comprising any one of:
wheatstone bridge sensing circuit;

a voltage proportional to absolute temperature (VPTAT);
a current proportional to absolute temperature (IPTAT); and
a differential amplifier.

16. The sensing device according to claim 1, wherein:
the flow sensor and the pressure sensor are configured to be operated in parallel so that both sensors operate simultaneously; or
wherein the flow sensor and the pressure sensor are configured to be operated in series so that one of the flow sensor and pressure sensor operates at a time,
wherein when the pressure sensor is not active, the piezo-elements of the pressure sensor are configured to operate as additional temperature sensing elements for the flow sensor, and
wherein the piezo-elements operating as additional temperature sensing elements provide information on a flow direction.

17. The sensing device according to claim 1, comprising a further etched portion in the substrate and a further membrane region is over an area of the further etched portion of the substrate, wherein either:
the first membrane region and the further membrane region each comprise said flow sensor and pressure sensor; or
the further membrane region comprises a flow sensor or a pressure sensor.

18. The sensing device according to claim 1, further comprising circuitry formed on the same chip with said sensor, or
being formed with circuitry in the same package, wherein:
the circuitry comprise any one of:
a voltage proportional to absolute temperature (VPTAT);
a current proportional to absolute temperature (IPTAT), switches, multiplexer, decoder, filter, amplifier, analogue to digital converter, timing blocks, RF communications circuits, memories; or
means for driving and reading out from the heating elements, temperature sensing elements and piezo-elements; or
means for electronically manipulating the sensor signals; or
means for enabling/disabling sensing elements.

19. The sensing device according to claim 1, comprising circuitry placed outside the chip area using application specific integrated circuit (ASIC) or a discrete component, or a combination of ASIC and the discrete component; and
wherein the substrate comprises any one of:
silicon;
silicon on insulator;
silicon carbide;
gallium arsenide;
gallium nitride; or
a combination of silicon carbide, gallium arsenide, gallium nitride with silicon; and
wherein the device is packaged using one or more of:
a metal transistor output (TO) type package;
a ceramic, metal or plastic surface mount package;
a flip-chip method;
a chip or wafer level package;
a printed circuitry board (PCB); and
further comprising through silicon via (TSV) configured to implement three dimensional (3D) stacking technique; and
wherein the first membrane region has any of:
a circular shape;
a rectangular shape;
a square shape; and
a rounded corner shape.

* * * * *